(12) United States Patent
Ganguly et al.

(10) Patent No.: US 9,530,898 B2
(45) Date of Patent: Dec. 27, 2016

(54) SEMICONDUCTOR DEVICES SUITABLE FOR NARROW PITCH APPLICATIONS AND METHODS OF FABRICATION THEREOF

(71) Applicant: APPLIED MATERIALS, INC., Santa Clara, CA (US)

(72) Inventors: Udayan Ganguly, Sunnyvale, CA (US); Yoshitaka Yokota, San Jose, CA (US); Jing Tang, Santa Clara, CA (US); Sunderraj Thirupapuliyur, San Jose, CA (US); Christopher Sean Olsen, Fremont, CA (US); Shiyu Sun, San Jose, CA (US); Tze Wing Poon, Sunnyvale, CA (US); Wei Liu, San Jose, CA (US); Johanes Swenberg, Los Gatos, CA (US); Vicky U. Nguyen, San Jose, CA (US); Swaminathar Srinivasan, Pleasanton, CA (US); Jacob Newman, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/515,767

(22) Filed: Oct. 16, 2014

(65) Prior Publication Data
US 2015/0102396 A1 Apr. 16, 2015

Related U.S. Application Data

(63) Continuation of application No. 12/558,370, filed on Sep. 11, 2009, now Pat. No. 8,871,645.
(Continued)

(51) Int. Cl.
H01L 29/788 (2006.01)
H01L 21/67 (2006.01)
(Continued)

(52) U.S. Cl.
CPC ....... H01L 29/788 (2013.01); H01L 21/67167 (2013.01); H01L 21/67207 (2013.01); H01L 21/76232 (2013.01); H01L 27/11521 (2013.01)

(58) Field of Classification Search
None
See application file for complete search history.

(56) References Cited

U.S. PATENT DOCUMENTS 5,201,992 A 4/1993 Marcus et al.
6,469,341 B1 * 10/2002 Sung ................ H01L 21/28273
257/316
(Continued)

OTHER PUBLICATIONS

Wolf et al. "Silicon processing for the VLSI Era, vol. 1: Process Technology", pp. 268-288, second edition.

*Primary Examiner* — Yasser A Abdelaziez
(74) *Attorney, Agent, or Firm* — Moser Taboada; Alan Taboada

(57) ABSTRACT

Semiconductor devices suitable for narrow pitch applications and methods of fabrication thereof are described herein. In some embodiments, a semiconductor device may include a floating gate having a first width proximate a base of the floating gate that is greater than a second width proximate a top of the floating gate. In some embodiments, a method of shaping a material layer may include (a) oxidizing a surface of a material layer to form an oxide layer at an initial rate; (b) terminating formation of the oxide layer when the oxidation rate is about 90% or below of the initial rate; (c) removing at least some of the oxide layer by an etching process; and (d) repeating (a) through (c) until the material layer is formed to a desired shape. In some embodiments, the material layer may be a floating gate of a semiconductor device.

8 Claims, 16 Drawing Sheets

Related U.S. Application Data

(60) Provisional application No. 61/096,175, filed on Sep. 11, 2008.

(51) Int. Cl.
*H01L 21/762* (2006.01)
*H01L 27/115* (2006.01)

(56) References Cited

U.S. PATENT DOCUMENTS

| | | | |
|---|---|---|---|
| 7,238,575 B2 * | 7/2007 | Ding | H01L 27/115 |
| | | | 257/E21.68 |
| 2007/0004137 A1 | 1/2007 | Oh et al. | |
| 2007/0278531 A1 * | 12/2007 | Choi | H01L 21/28273 |
| | | | 257/213 |

* cited by examiner

SEMICONDUCTOR DEVICES SUITABLE FOR NARROW PITCH APPLICATIONS AND METHODS OF FABRICATION THEREOF

CROSS REFERENCE TO RELATED APPLICATIONS

This application is a continuation of co-pending U.S. patent application Ser. No. 12/558,370, filed Sep. 11, 2009, which claims benefit of U.S. provisional patent application Ser. No. 61/096,175, filed Sep. 11, 2008. Each of the aforementioned related patent applications is herein incorporated by reference in its entirety.

FIELD

Embodiments of the present invention generally relate to the field of semiconductor manufacturing processes and devices, and more particularly, to devices suitable for use in narrow pitch applications.

BACKGROUND

Scaling semiconductor devices by simply shrinking the device structure often does not produce acceptable results at small dimensions. For example, in NAND flash memory devices, when a floating gate is scaled the capacitive coupling (e.g., sidewall capacitance) of the floating gate is scaled accordingly with the surface area of the floating gate. As such, the smaller the surface area of the floating gate, the smaller the capacitive coupling between the floating gate and, for instance, a control gate. Typically, a trade-off that sacrifices capacitive coupling for scaling is acceptable provided the NAND memory device still functions. Unfortunately, the scaling is limited when the device node becomes sufficiently small such that the capacitive coupling between the floating gate and control gate becomes too small to effectively program the device at permissible operational voltages. Furthermore, parasitic capacitance (i.e., noise) between adjacent floating gates increases beyond the margin for read error of a system controller in a NAND memory device. Thus, a functioning NAND device is not possible under such conditions.

Further, the inventors have discovered that forming the floating gate to a smaller critical dimension and/or desired shape can result in undesired thickening of underlying layers, for example, such as a tunnel oxide layer in a NAND device using conventional oxidation processes.

SUMMARY

Semiconductor devices suitable for narrow pitch applications and methods of fabrication thereof are described herein. In some embodiments, a semiconductor device may include a floating gate having a first width proximate a base of the floating gate that is greater than a second width proximate a top of the floating gate. In some embodiments, the width of the floating gate decreases non-linearly from the first width to the second width.

In some embodiments, a method of forming a semiconductor device may include providing a substrate having a material layer to be formed into a floating gate; and forming the floating gate using an oxidation process to shape the material layer into a desired shape having a first width proximate a base of the floating gate that is greater than a second width proximate a top of the floating gate.

In some embodiments, the oxidation process may further include (a) oxidizing a surface of the material layer to form an oxide layer; (b) terminating formation of the oxide layer when the oxidation rate is about 90% or below of the initial rate; (c) removing at least some of the oxide layer by an etching process; and (d) repeating (a) through (c) until the material layer is formed into the desired shape of the floating gate.

In some embodiments, a method of shaping a material layer may include (a) oxidizing a surface of a material layer to form an oxide layer at an initial rate; (b) terminating formation of the oxide layer when the oxidation rate is about 90% or below of the initial rate; (c) removing at least some of the oxide layer by an etching process; and (d) repeating (a) through (c) until the material layer is formed to a desired shape. In some embodiments, terminating the etching process occurs when the etching rate is falls between about 0% to about 90% of the initial rate.

In some embodiments, the method of shaping the material layer further includes providing a substrate having the material layer disposed thereon and having a mask layer disposed atop an upper surface of the material layer, wherein the material layer is formed into the desired shape having a first width proximate a base of the desired shape that is substantially equivalent to a second width proximate a top of the desired shape. In some embodiments, the substrate comprises at least one of a silicon-containing layer, an oxygen-containing layer, or a non-silicon containing layer.

In some embodiments, a method of forming a semiconductor device includes providing a partially formed semiconductor device comprising a substrate having a tunnel oxide layer, a material layer disposed above the tunnel oxide layer, and a shallow trench isolation region disposed adjacent to the tunnel oxide layer; and forming a floating gate from the material layer, the floating gate having a first width proximate a base of the floating gate that is greater than a second width proximate a top of the floating gate, wherein a width of the float gate decreases non-linearly from the first width to the second width.

In some embodiments, the material layer for forming the floating gate is part of a partially fabricated semiconductor memory device including a substrate having a tunnel oxide layer and the material layer disposed thereon, wherein the material layer is disposed above the tunnel oxide layer and wherein a shallow trench isolation region is disposed adjacent to the tunnel oxide layer.

In some embodiments, forming the floating gate includes selectively oxidizing the material layer to form a first oxide layer; and removing the first oxide layer. In some embodiments, upon removing the first oxide layer, the method further comprises removing a portion of the material layer using a etch process. In some embodiments, upon removing the first oxide layer, the method further comprises selectively oxidizing the material layer to form a second oxide layer; and removing the second oxide layer.

In some embodiments, forming the floating gate includes forming a nitride layer on the material layer; selectively oxidizing the nitride layer and the material layer to form an oxynitride layer and an oxide layer; and removing the oxynitride layer and the oxide layer. In some embodiments, the nitride layer is used as an oxidation barrier.

In some embodiments, an apparatus for processing a substrate may include a transfer chamber; a first plurality of process chambers configured for an oxidation process coupled to the transfer chamber; and a second plurality of process chambers configured for an etch process coupled to the transfer chamber. In some embodiments, a process chamber configured for a nitridization process may be coupled to the process chamber.

In some embodiments, an apparatus for processing a substrate may include a process chamber having a substrate support disposed therein and configured to support a substrate in at least two processing zones, the substrate support further having a temperature control system coupled thereto to control the temperature of the substrate support proximate a first temperature; a gas source to provide at least an oxygen-containing gas, an inert gas and an etching gas; a plasma source coupled to the process chamber to provide energy to gases provided by the gas source to form at least one of an oxidizing plasma or an etching plasma; and a heat source coupled to the process chamber to provide energy to the substrate to selectively raise the temperature of the substrate to a second temperature greater than the first temperature. Other and further embodiments of the present invention are described hereinbelow.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
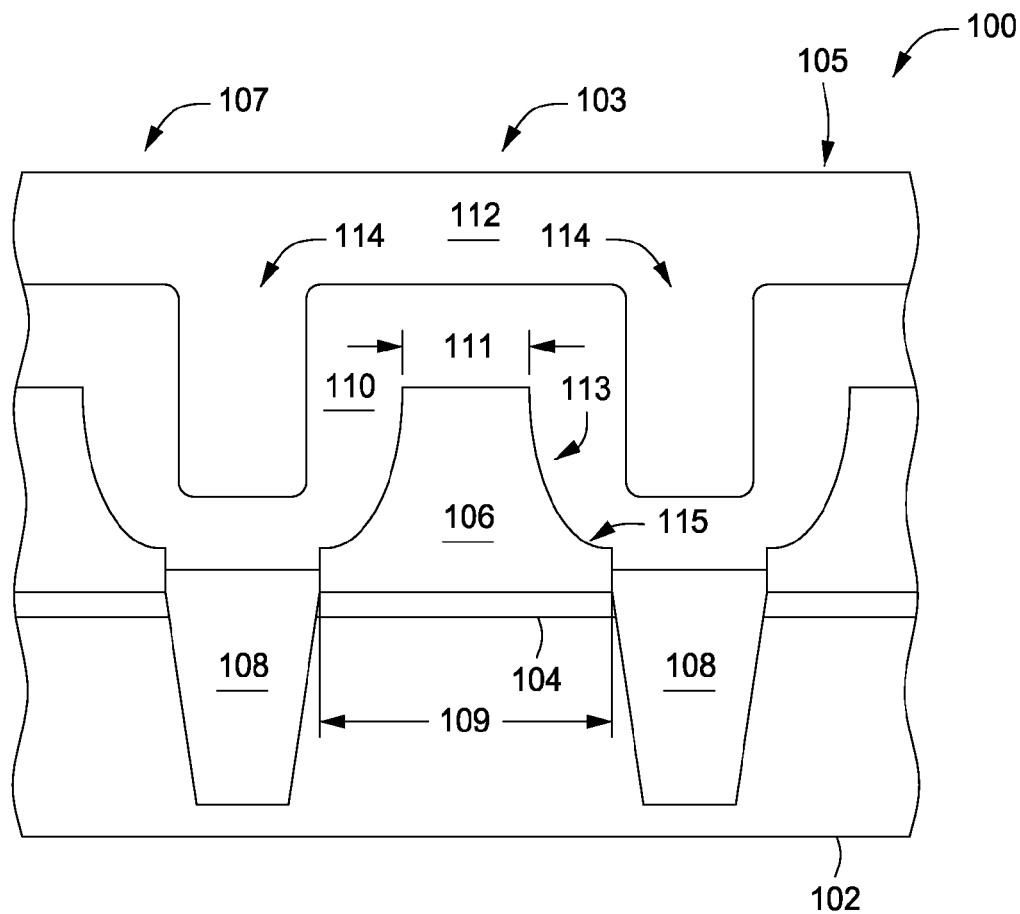
FIG. 1 depicts a semiconductor structure having a floating gate in accordance with some embodiments of the present invention.

The drawings have been simplified for clarity and are not drawn to scale. To facilitate understanding, identical reference numerals have been used, wherever possible, to designate identical elements that are common to the figures. It is contemplated that some elements of one embodiment may be beneficially incorporated in other embodiments.

DETAILED DESCRIPTION

Semiconductor devices and structures suitable for narrow pitch applications and methods of fabrication thereof are described herein. As used herein, narrow pitch applications include half-pitches of 32 nm or less (e.g., device nodes of 32 nm or less). Of course, the inventive semiconductor devices and structures may be utilized in applications having greater pitches as well. The inventive semiconductor devices may be, for example, NAND or NOR flash memory, or other suitable devices. In some embodiments, the inventive semiconductor devices disclosed herein advantageously maintain or improve sidewall capacitance between a floating gate and, for example, a control gate of the device, thereby reducing interference (i.e., noise) between adjacent floating gates in adjacent devices. The inventive methods disclosed herein advantageously limit undesired effects, such as oxygen diffusion which can, for example, thicken a tunnel oxide layer during processing. Further, the inventive methods can advantageously be applied towards the fabrication of other devices or structures, for example, such as Fin Field Effect Transistors (FinFET) devices, hard mask structures, or other structures, to overcome size limitations in the critical dimension imposed by conventional lithographic patterning. It is contemplated that the specific oxidation and etching processes disclosed herein with respect to the formation of one structure may be utilized in the formation of any other structure disclosed herein unless noted to the contrary.

An inventive semiconductor device in accordance with some embodiments of the present invention is described below with respect to FIG. 1 in an illustrative application as a memory device 100. The memory device 100 includes a substrate 102 having a tunnel oxide layer 104 disposed thereon. A floating gate 106 is disposed on the tunnel oxide layer 104. The floating gate 106, the tunnel oxide layer 104, and the underlying portion of the substrate 102 may comprise a cell 103 (or memory unit) of the memory device 100. Each cell of the memory device may be separated. For example, in the memory device 100, a shallow trench isolation (STI) region 108 is disposed in the substrate 102 between each cell (for example, adjacent to the tunnel oxide layer 104 and floating gate 106, where the STI region 108 separates the cell 103 from adjacent cells 105 and 107). The memory device 100 further includes an inter-poly dielectric (IPD) layer 110 disposed above the floating gate 106 and a control gate layer 112. The IPD layer 110 separates the floating gate 106 from the control gate layer 112.

The substrate 102 may comprise a suitable material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like. In some embodiments, the substrate 102 comprises silicon. The tunnel oxide layer 104 may comprise silicon and oxygen, such as silicon oxide ($SiO_2$), silicon oxynitride (SiON), or high-k dielectric materials, such as aluminum- (Al), hafnium- (Hf), or lanthanum- (La), zirconium- (Zr) based oxides or oxinitrides, or silicon nitrides ($Si_xN_y$), in single or layered structures (e.g., SiO$_2$/high-k/SiO$_2$), or the like. The tunnel oxide layer 104 may have any suitable thickness, for example, between about 5 to about 12 nm. The tunnel oxide layer 104 may have a width, within each cell, substantially equivalent to the width of a base of the floating gate 106. The STI region 108 may comprise silicon and oxygen, such as silicon oxide (SiO$_2$), silicon oxynitride (SiON), or the like.

The floating gate 106 typically comprises a conductive material, such as polysilicon, metals, or the like. The floating gate 106 has a configuration suitable to facilitate disposing portions of the control gate layer 112 between adjacent cells (e.g., between cells 103, 105, and 107). As such, the floating gate may be formed in an inverted "T" shape. As used herein, the term inverted "T" refers generally to the geometry of the structure wherein an upper portion of the floating gate 106 is relieved with respect to a base of the floating gate 106. Such relief provides room for the IPD layer 110 to be formed over the floating gate 106 without completely filling the gap between adjacent floating gates 106, thereby allowing a portion of the control gate layer 112 to be disposed between adjacent floating gates 106.

For example, as illustrated in FIG. 1, the floating gate 106 is generally shown in the shape of an inverted T having a base 115 and a stem 113 (or an upper portion of the floating gate 106). The floating gate 106 may generally have any dimensions as desired for a particular application. In some embodiments, the height of the floating gate 106 may be between about 20 to about 100 nm. In some embodiments, the thickness of the base 115 may be less than or equal to about 35 nm.

Due to the relief of the upper portion of the floating gate 106, the floating gate 106 has a first width 109 proximate the base 115 of the floating gate 106 that is greater than a second width 111 proximate the top of the floating gate 106. In some embodiments, a ratio of the first width 109 to the second width 111 is at least about 2:1. In some embodiments, the first width 109 may exceed the second width 111 by about 4 nm or more, or about 6 nm or more, or between about 4 to about 6 nm. The width of the floating gate 106 may vary linearly, non-linearly, continuously, non-continuously, in any fashion, between the base 115 and the top of the floating gate 106. In some embodiments, and as illustrated in FIG. 1, the width of the floating gate 106 varies non-linearly between the first width 109 and the second width 111. In some embodiments, the first width may be less than about 35 nm, or between about 20 to about 35 nm. The second width may be between about 5 to about 30 nm.

The stem 113 may have a sidewall portion thereof having a substantially vertical profile, as illustrated in FIG. 1. In some embodiments, substantially vertical means less than or equal to about 10 degrees of vertical, or less than or equal to about 5 degrees of vertical, or less than or equal to about 1 degree of vertical. The substantially vertical profile of the sidewall may be up to about 40 percent, or greater than about 40 percent of the total height of the floating gate 106. In some embodiments, the substantially vertical profile is greater than about 40 percent of the height of the floating gate 106. In some embodiments, the substantially vertical profile is between about 20 to about 100 nm.

The IPD layer 110 may comprise any suitable single or multi-layer dielectric materials. A single layer IPD may comprise SiO$_2$, SiON, a high-k dielectric material as discussed above with respect to tunnel oxide layer 104, or the like. A non-limiting example of a multi-layer IPD is a multi-layer ONO layer comprising a first oxide layer, a nitride layer, and a second oxide layer. The first and second oxide layers typically comprise silicon and oxygen, such as silicon oxide (SiO$_2$), silicon oxynitride (SiON), or the like. The nitride layer typically comprises silicon and nitrogen, such as silicon nitride (SiN), or the like. In some embodiments, a multi-layer IPD layer comprising SiO$_2$/high-k/SiO$_2$ (such as, SiO$_2$/Al$_2$O$_3$/SiO$_2$) can also be used as the IPD layer 110. In some embodiments, the IPD layer 110 is deposited to a thickness of between about 12 to about 15 nm.

Conformal deposition of the IPD layer 110 over the inverted T shape of the floating gate 106 facilitates forming a well 114 in the deposited IPD layer 110. The well 114 is formed between adjacent floating gates. In some embodiments, the well 114 has a width of between about 4 to about 20 nm and a depth of between about 20 to about 90 nm.

Optionally, prior to IPD deposition, the depth level of the IPD penetration between adjacent floating gates may be defined by depositing a layer of material, such as SiO$_2$, to fill the gap between adjacent floating gates, planarizing the layer of material, for example, by chemical mechanical planarization (CMP), to remove excess material down to the top of the floating gate 106. The material remaining in the gap between adjacent floating gates may then be etched to a desired depth to set the level of IPD penetration between the floating gates.

The control gate layer 112 may be deposited atop the IPD layer 110 and in the well 114 to form a control gate. The control gate layer 112 typically comprises a conductive material, such as polysilicon, metal, or the like. The addition of the well 114 provides a larger surface area for the control gate layer 112 proximate a sidewall of the floating gate 106. The increased surface area of the control gate layer 112 facilitated by the well 114 may advantageously improve capacitive coupling between a sidewall of the floating gate 106 and the control gate. Further, the well 114, disposed between adjacent floating gates (for example, those of cells 103 and 105) may reduce parasitic capacitance between adjacent floating gates, floating gate interference, noise, or the like. In addition, the inverted T shape of the floating gate 106 reduces the surface area as compared to an approximate rectangle for the same floating gate height. The reduced cross-section advantageously reduces parasitic capacitance between adjacent floating gates in the bitline direction (e.g., in a different word line and the same bit line of a memory device). Advantageously, the sidewall capacitance between the floating gate and the control gate can be independently controlled (e.g., maintained at a desirable level) by control of the height of the floating gate.

Figure 2:
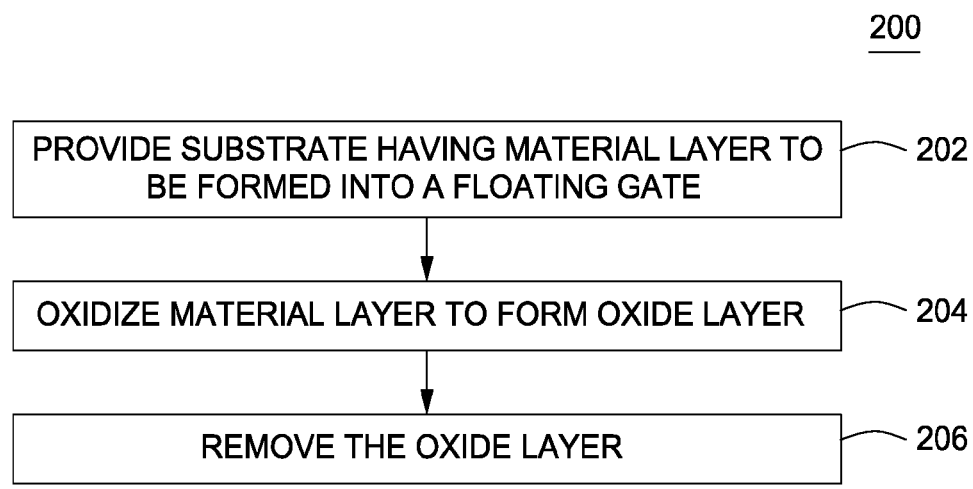
FIG. 2 depicts a flow chart for a method of forming a floating gate in accordance with some embodiments of the present invention.

FIG. 2 depicts a method 200 of fabricating a semiconductor device having a floating gate geometry in accordance with some embodiments of the present invention. The method 200 is illustratively described with reference to FIGS. 3A-C, which depicts stages of fabrication of a memory device 300 in accordance with the embodiments of the method 200. Portions of the methods described herein may be performed in any suitable chamber configured for plasma oxidation, rapid thermal oxidation (RTO), radical oxidation, or the like. Suitable oxidation chambers may include RADIANCE®, Plasma Immersion Ion Implantation (P3I), Decoupled Plasma Oxidation (DPO), or VANTAGE® RADOX™ chambers available from Applied Materials, Inc. of Santa Clara, Calif. Exemplary thermal oxidation processes may be performed with various oxidative chemistries include varying reducing gas concentration for reducing gases, such as one or more of hydrogen (H$_2$), ammonia (NH$_3$) or the like within an oxidative gas mixture include oxidative gases, such as one or more of oxygen (O$_2$), nitric oxide (NO), nitrous oxide (N$_2$O) or the like, and optionally including inert gases, such as one or more of nitrogen (N$_2$), argon (Ar), helium (He), or the like. Exemplary plasma oxidation processes may use any of the oxidative chemistries discussed above for thermal oxidation processes, and may be performed with or without a heating chuck. Photochemical processes, for example utilizing ozone ($O_3$) in the presence of ultraviolet light (UV) to form an oxide layer, or wet chemical oxidation, for example utilizing a chemical solution including nitric acid ($HNO_3$) another suitable acid for oxidation, can also be applied.

Other portions of the methods described herein may be performed in any suitable etch chamber configure for wet or dry etch, reactive ion etch (RIE), or the like. Exemplary etch chambers include the SICONI™, Producer®, or Carina™ chambers, also available from Applied Materials, Inc. of Santa Clara, Calif. One non-limiting, exemplary dry etch process may include ammonia or ($NH_3$) or nitrogen trifluoride ($NF_3$) gas, or an anhydrous hydrogen fluoride (HF) gas mixture with a remote plasma, which condenses on $SiO_2$ at low temperatures (e.g., ~30° C.) and reacts to form a compound which can be sublimated at moderate temperature (e.g., >100° C.) to produce the etching of $SiO_2$. Such an exemplary etch process can diminish over time and eventually saturate to a point where no further etching occurs unless portions of the compound are removed (for example, by the sublimation process described above). The etch process can be controlled using the above mechanism and/or by a timed etch process (e.g., etching for a predetermined period of time). Exemplary wet etch processes may include hydrogen fluoride (HF) or the like. Exemplary plasma or remote plasma etch processes may include one or more etchants such as carbon tetrafluoride ($CF_4$), trifluoromethane ($CHF_3$), sulfur hexafluoride ($SF_6$), hydrogen ($H_2$), or the like, and may be performed with or without a heating chuck. The etch selectivity can be engineered to be between about 1 to about 1000 for different materials combinations, such as heterogeneous surfaces and the like. For example, and in some embodiments, the etch selectivity can be about 100 for silicon (Si) in a silicon dioxide ($SiO_2$) etch. The etch can be terminated as the etch rate drops to between about 0% to about 90%, or to about 75% of the initial etch rate to provide thickness control of the materials being etched. For example, in some embodiments, terminating the etch process as discussed above may provide thickness control when etching. This control may be particularly advantageous when etching an oxide layer disposed atop heterogeneous materials, for example, including silicon (Si) and silicon dioxide ($SiO_2$).

Figure 9A:
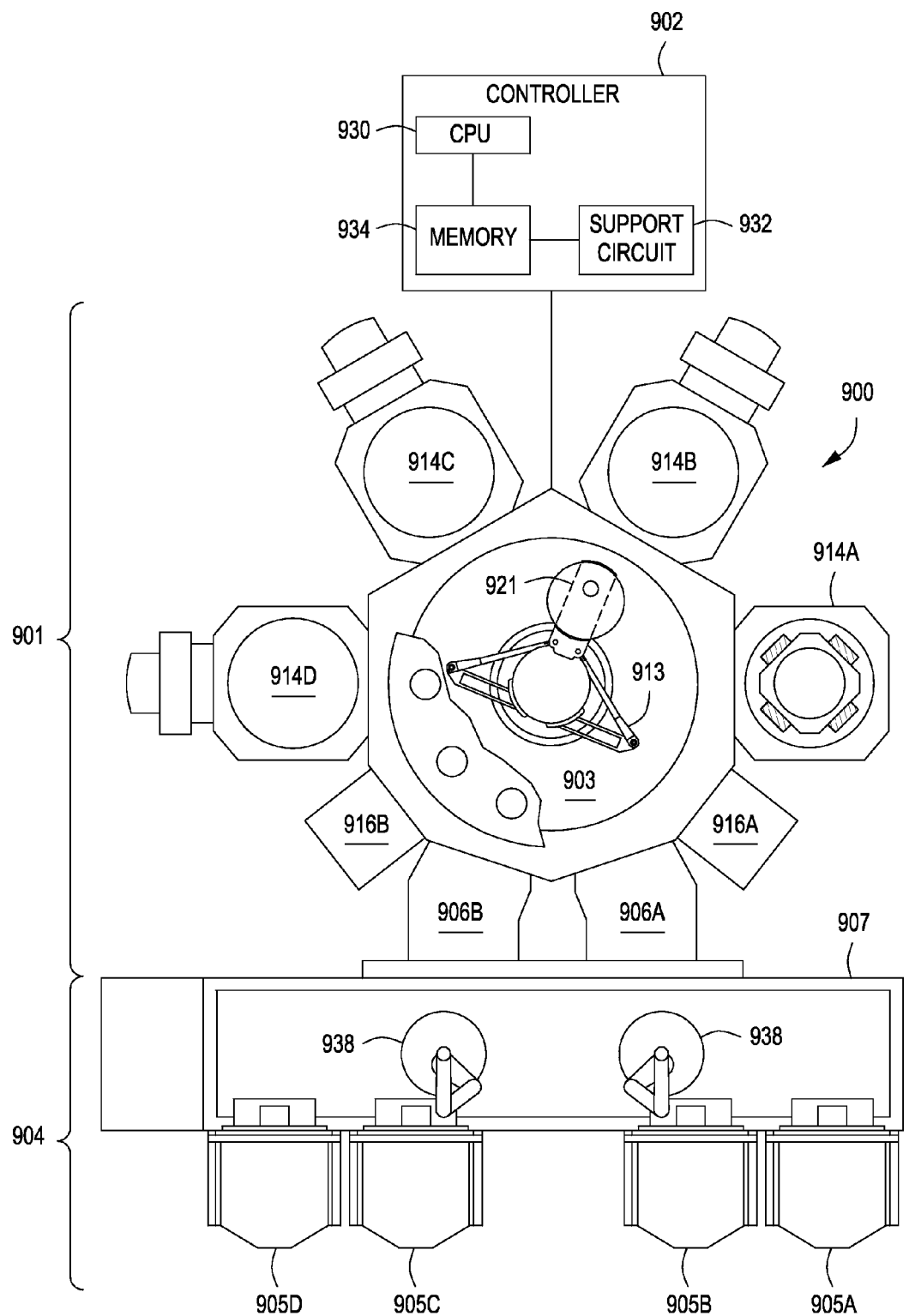
FIG. 9A-B depicts exemplary cluster tools suitable for performing portions of the present invention.

The oxidation and etch chambers, along with other chambers suited for the fabrication of the memory device (e.g., deposition chambers, cleaning chamber, and the like) may be part of a cluster tool, such as one of the CENTURA® or ENDURA® line of cluster tools, also available from Applied Materials, Inc. Exemplary cluster tools are described below with respect to FIGS. 9A-B. A cluster tool may provide a high throughput advantage during production with the inventive methods by completion of a portion or all of the inventive methods in a single cluster tool. For example, a cluster tool can complete multi-chamber processes without vacuum breaks between every chamber. Such vacuum break reduction can minimize pump up/down times to improve throughput and/or provide better process control. Depending on processing times and number of cycles of oxidation and etch using the inventive methods, different configuration in the cluster tool maybe required to maximize throughput and chamber utilization as discussed below.

Figure 3A:
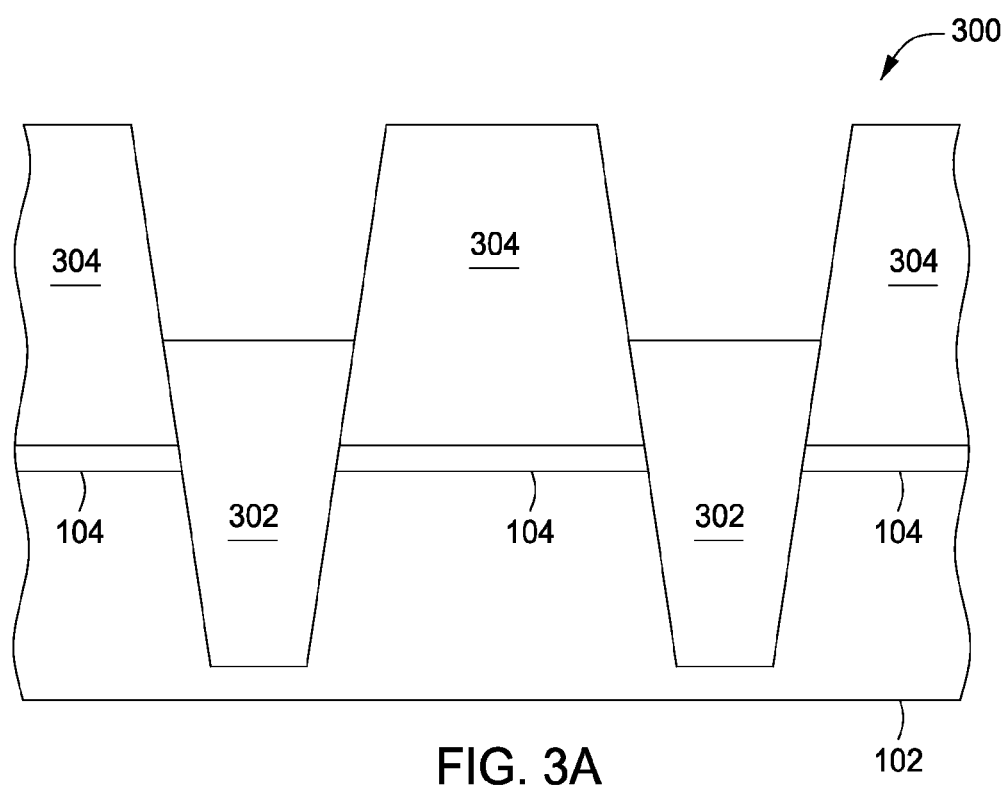
FIGS. 3A-C depict stages of fabrication of a floating gate in accordance with some embodiments of the method of FIG. 2.

The method 200 generally begins at 202, where a substrate having a material layer to be formed into a floating gate may be provided. For example, as shown in FIG. 3A, the substrate 102 and material layer 304 may be part of a partially fabricated memory device 300. The memory device 300 may comprise the substrate 102 having the tunnel oxide layer 104 disposed thereon. The material layer 304 may be deposited atop the tunnel oxide layer 104. A shallow trench isolation (STI) region 302 (similar to STI region 108) may be disposed adjacent to the tunnel oxide layer 104 and the material layer 304. Other fabrication steps to provide the substrate and partially fabricated memory device 300 performed prior to beginning the method 200 include deposition of an isolation material, such as $SiO_2$, in the STI region 302, planarizing the isolation material level with an upper surface of the material layer 304, and etching the isolation material down to a desired level to result in a substrate having the material layer 304 ready to be processed into a floating gate in accordance with the teachings provided herein.

The material layer 304 may comprise a conductive material, such as polysilicon, a metal or the like. The material layer 304 may generally have a slightly trapezoidal or rectangular cross section. The material layer 304 may generally have any suitable starting shape such that when oxidized and/or etched by the methods described herein, the material layer 304 may be formed into a floating gate having an inverted T shape as described above with respect to FIG. 1 (for example, the material layer 304 may be patterned and etched to facilitate forming the STI structures 302, and the resultant profile of the material layer 304 may be the starting point for further processing as disclosed herein).

Figure 3B:
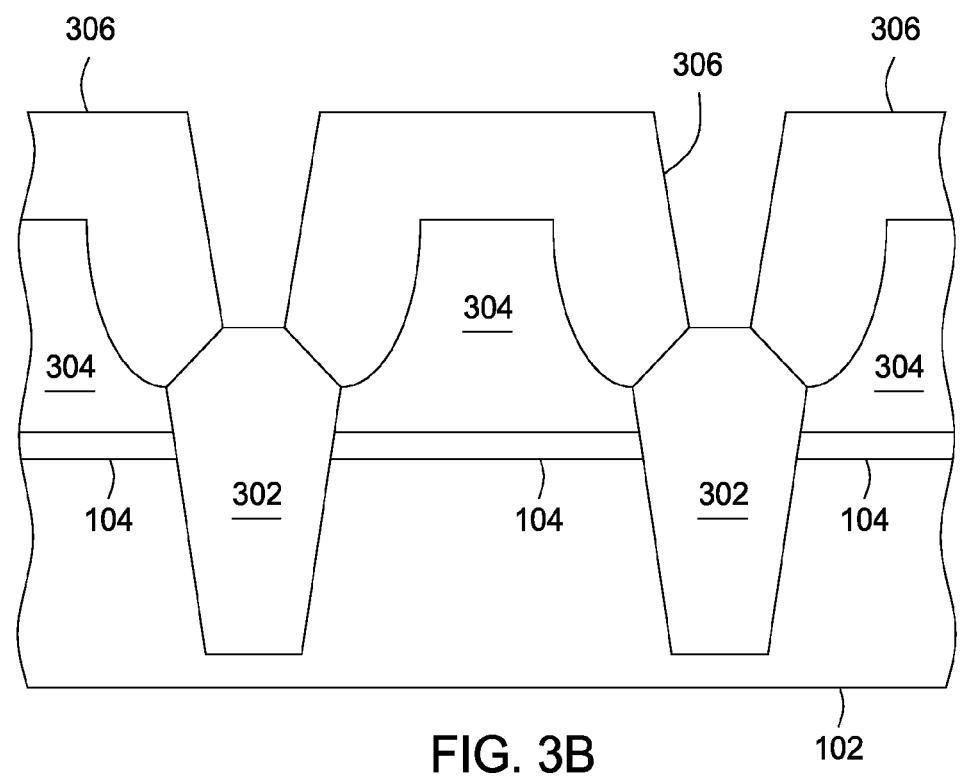

At 204, the material layer 304 is selectively oxidized to form an oxide layer 306 as shown in FIG. 3B. The oxide layer 306 is formed on the top and sidewalls of the material layer 304, and may comprise a silicon oxide, metal oxide, or the like. In some embodiments, the oxide layer 306 may consume the material layer 304 to a depth of about 3 to about 15 nm, or about 10 nm. The oxide layer 306 may further consume a portion of the STI region 302 as shown in FIG. 3B. The oxide layer 306 may be formed using wet or dry oxidation, rapid thermal oxidation (RTO), radical oxidation, plasma oxidation, for example, decoupled plasma oxidation (DPO), or any other oxidation process described herein. In some embodiments, where a low thermal budget and/or reduced diffusion of oxygen are desired, plasma oxidation or radical oxidation may be utilized. A low thermal budget may be required to prevent thickening of the tunnel oxide layer 104 during the oxidation of the material layer 304. As used herein, a low thermal budget means a thermal budget less than a furnace process of tens of minutes at 850 degrees Celsius peak temperature.

Figure 3C:
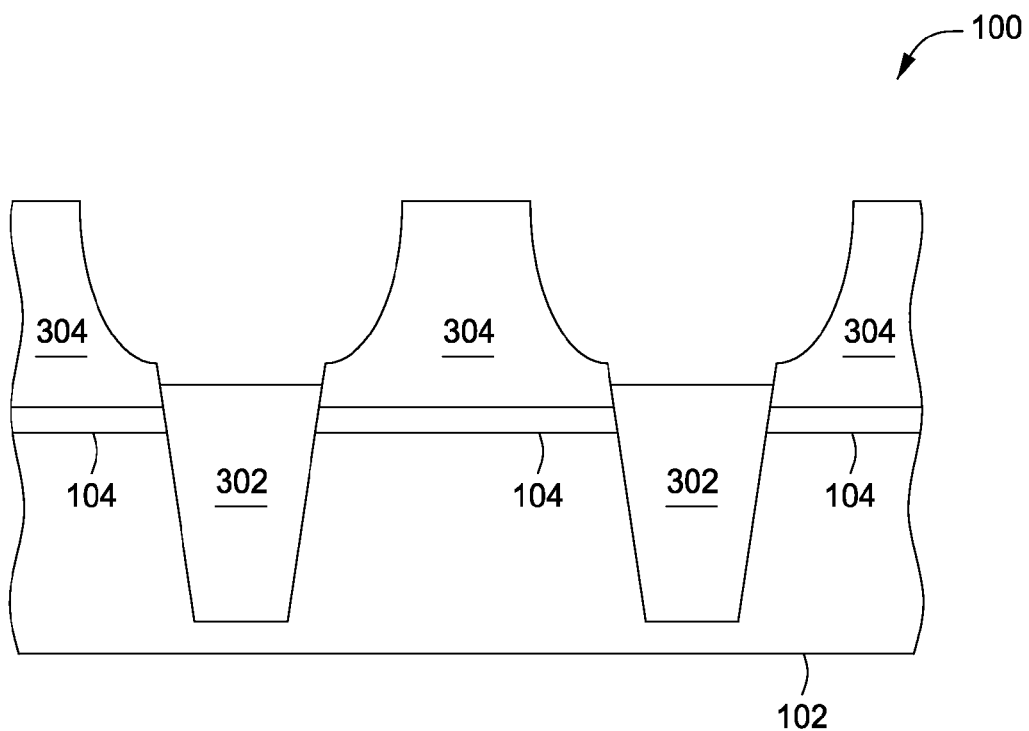

Next, at 206, the oxide layer 306 is removed by an etch process, as depicted in FIG. 3C. The remaining portion of the material layer 304 after oxidation of the material layer 304 and removal of the oxide layer 306 may be generally in the shape of an inverted T, for example, similar to the shape of the floating gate 106 depicted in FIG. 1. The etch process may be a wet or dry etch, or a reactive ion etch. The etch process may use chemicals or gases comprising hydrofluoric acid (HF) hydrochloric acid (HCl), or other etch processes disclosed herein, or the like. The etch process may be selective, for example, selectively removing the oxide layer 306. In one embodiment, the etch process is selective to silicon oxide, and removes the oxide layer 306 comprising silicon oxide relative to the material layer comprising polysilicon. The etch process may further remove a portion of the STI region 302 during removal of the oxide layer 306.

Upon completion of the etch process to form a floating gate having an inverted T shape, the method 200 generally ends. Further processing of the memory device may include the deposition of an IPD layer and a control gate layer, similar to those layers described with respect to FIG. 1. In some embodiments, prior to the deposition of an IPD layer, the region between adjacent material layers 304 and above the STI region 302 is filled with a gap fill material, for example, $SiO_2$ or the same material that comprises the STI region 302. Next, the top of this filled region can be planarized by chemical mechanical planarization (CMP), or any suitable planarization method, to be substantially even with the top of the material layer 304. The gap fill and CMP are followed by an etch of the gap fill material to set a desired penetration depth for the IPD between the adjacent material layers 204, prior to deposition of the IPD layer.

Figure 4:
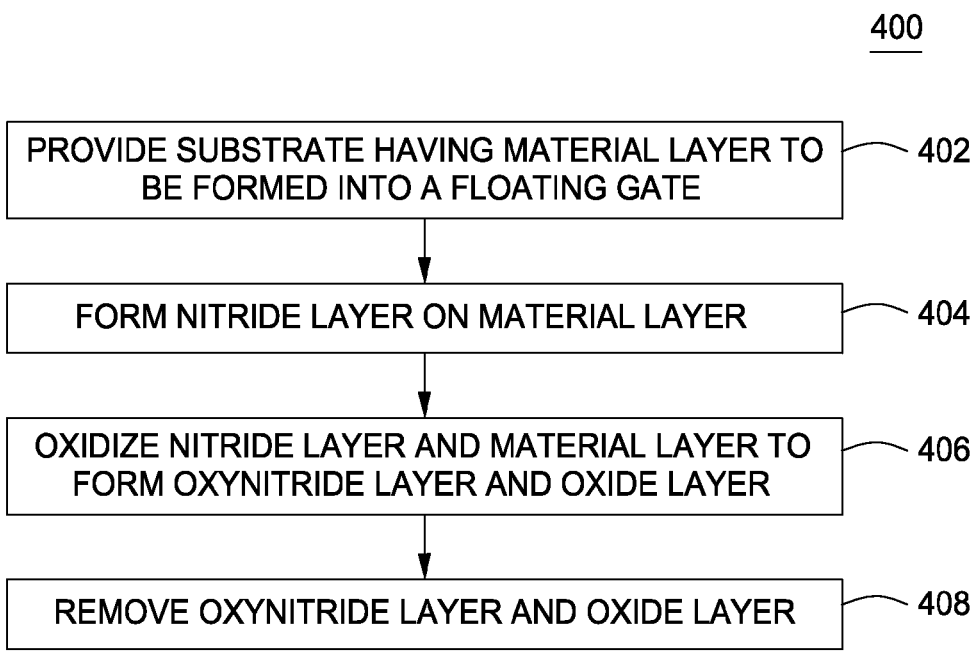
FIG. 4 depicts a flow chart for a method of forming a floating gate in accordance with some embodiments of the present invention.

Alternatively, the floating gate having an inverted T shape may be formed using a method 400, as depicted in FIG. 4. The method 400 is illustratively described with reference to FIGS. 5A-E, which depicts stages of fabrication of the memory device 300 in accordance with the embodiments of the method 400. The method 400 includes the deposition of a sacrificial nitride layer, which may be utilized to limit the diffusion of oxygen during a oxidation process used to oxidize the material layer 304. It may be desired to limit oxygen diffusion to prevent undesirable thickening of the tunnel oxide layer 104 and/or to prevent undesirable removal of portions of the tunnel oxide layer 104 and/or the STI region 302 (or the gap fill material) during the oxide layer removal process as described below.

Figure 5A:
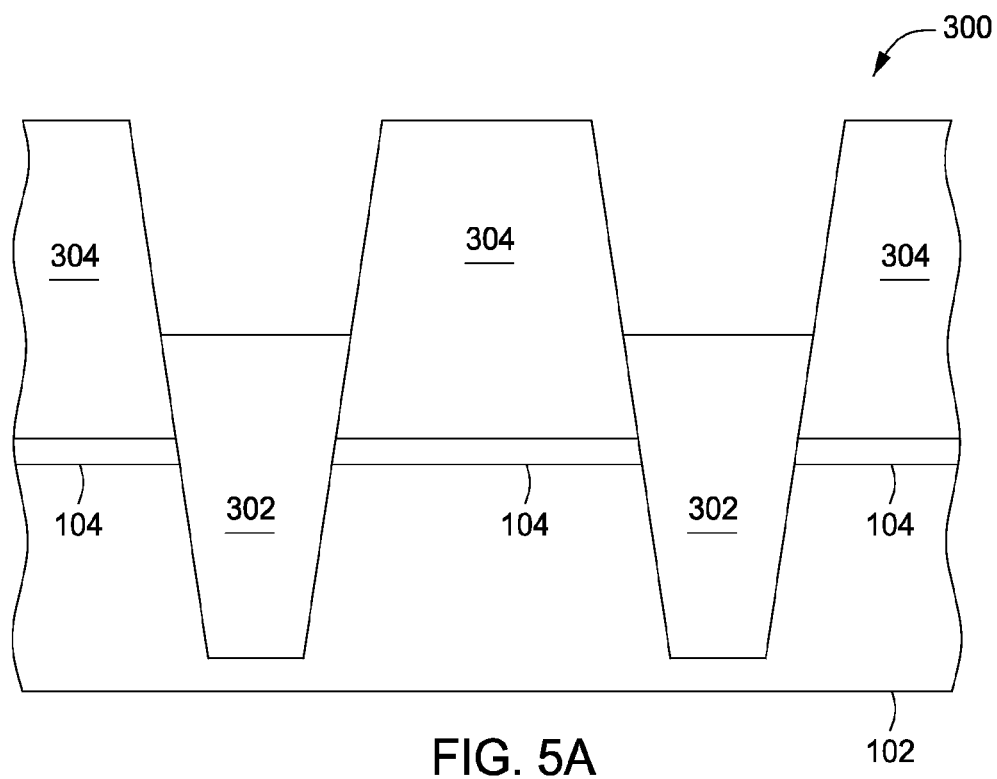
FIGS. 5A-E depict stages of fabrication of a floating gate in accordance with some embodiments of the method of FIG. 4.
Figure 5B:
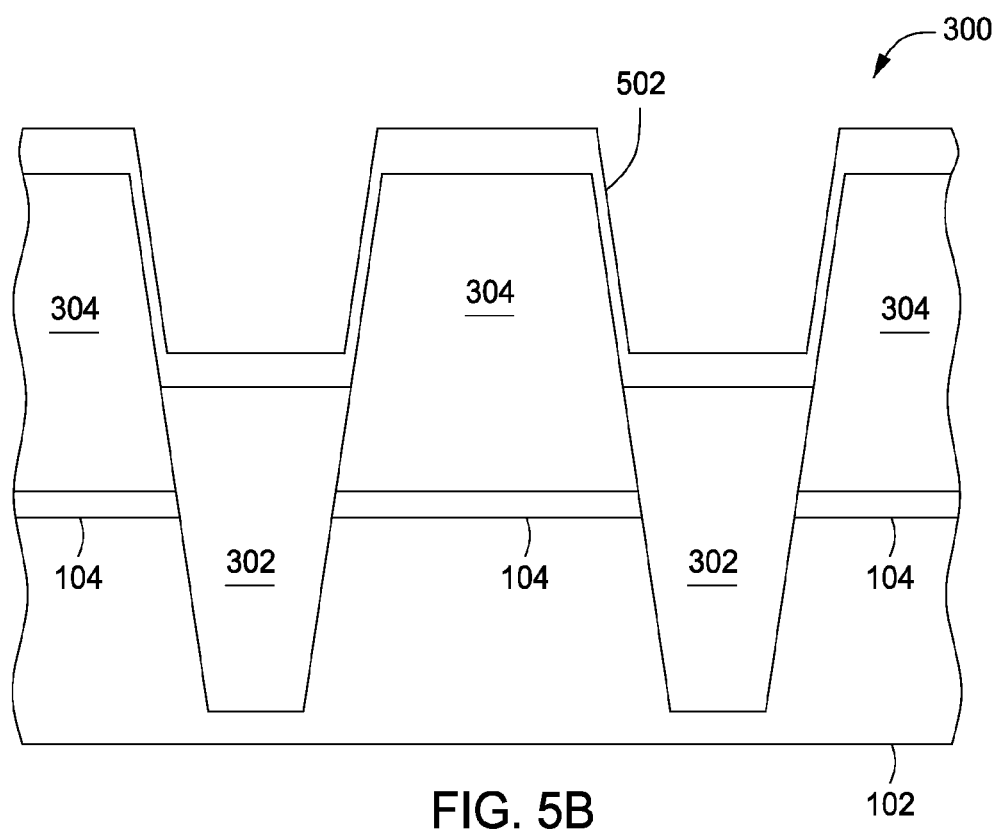

The method 400 generally begins at 402, where the partially fabricated memory device 300 is provided as illustrated in FIG. 5A. The memory device 300 has been described above, and includes the substrate 102 having a tunnel oxide layer 104 disposed thereon and having the material layer 304 disposed above the tunnel oxide layer 104. The memory device 300 further includes the STI layer 302 disposed in the substrate 102 and adjacent to the tunnel oxide layer 104 and material layer 304.

Figure 5C:
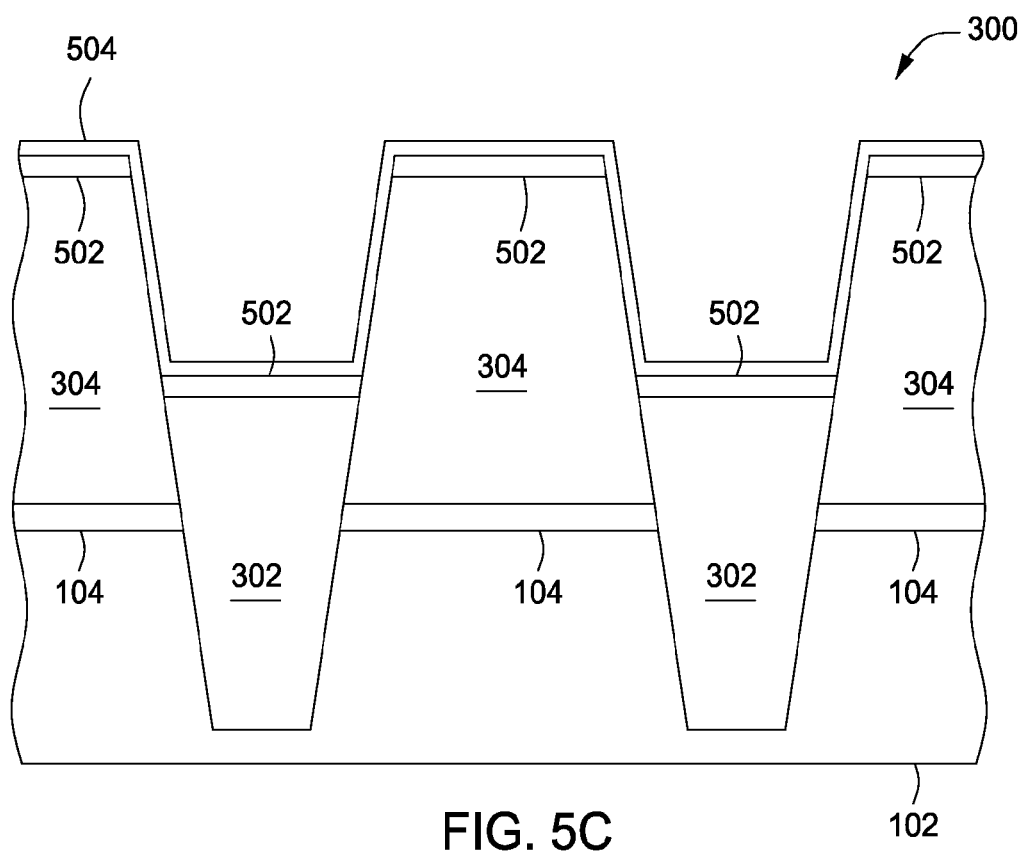

At 404, a nitride layer 502 is formed on the exposed surfaces of the material layer 304 and the STI region 202 as illustrated in FIG. 5C. The nitride layer 502 may be formed by any suitable nitridation process, for example, plasma nitridation or silicon nitride deposition. The nitride layer 502 may comprise silicon nitride (SiN), silicon oxynitride (SiON), or both. The nitride layer 502 may be formed to a greater thickness on the horizontal surfaces of the material layer 304 and STI region 302 as compared to the sidewall of the material layer 304 (for example, by a directional nitridation process). In some embodiments, a ratio of nitride layer thickness on the horizontal surfaces of the material layer 304 and STI region 302 to that on the sidewall of the material layer 304 is about 2:1 to about 10:1. In some embodiments, the nitride layer 502 has a thickness of about 5 to about 10 nm on the horizontal surfaces of the material layer 304 and the STI region 302. In some embodiments, the nitride layer 502 has a thickness of about 1 nm or less on the sidewalls of the material layer 304.

At 406, the nitride layer 502 and the material layer 304 are selectively oxidized to form an oxynitride layer 504 and an oxide layer 506. The oxidation process may be any suitable oxidation process as discussed above with respect to method 200, and may be performed in a single stage process described with respect to FIGS. 5C-D. Initially, as depicted in FIG. 5C, the oxidation process facilitates the formation of an oxynitride layer 504. The oxynitride layer 504 may consume a portion of the nitride layer 502 on the horizontal surface of the material layer 304 and STI region 302, and may consume substantially the entire nitride layer 502 on the sidewall of the material layer 304. The increased thickness of the nitride layer 502 on the horizontal surfaces may limit or prevent oxidation of those underlying surfaces. Upon consumption of the nitride layer 502 on the sidewall of the material layer 304, the oxidation process may consume a portion of the material layer 304. The oxidation of the sidewalls of the material layer may proceed more quickly than on the horizontal surfaces due to the remaining unconsumed nitride layer 502 disposed on those surfaces.

Figure 5D:
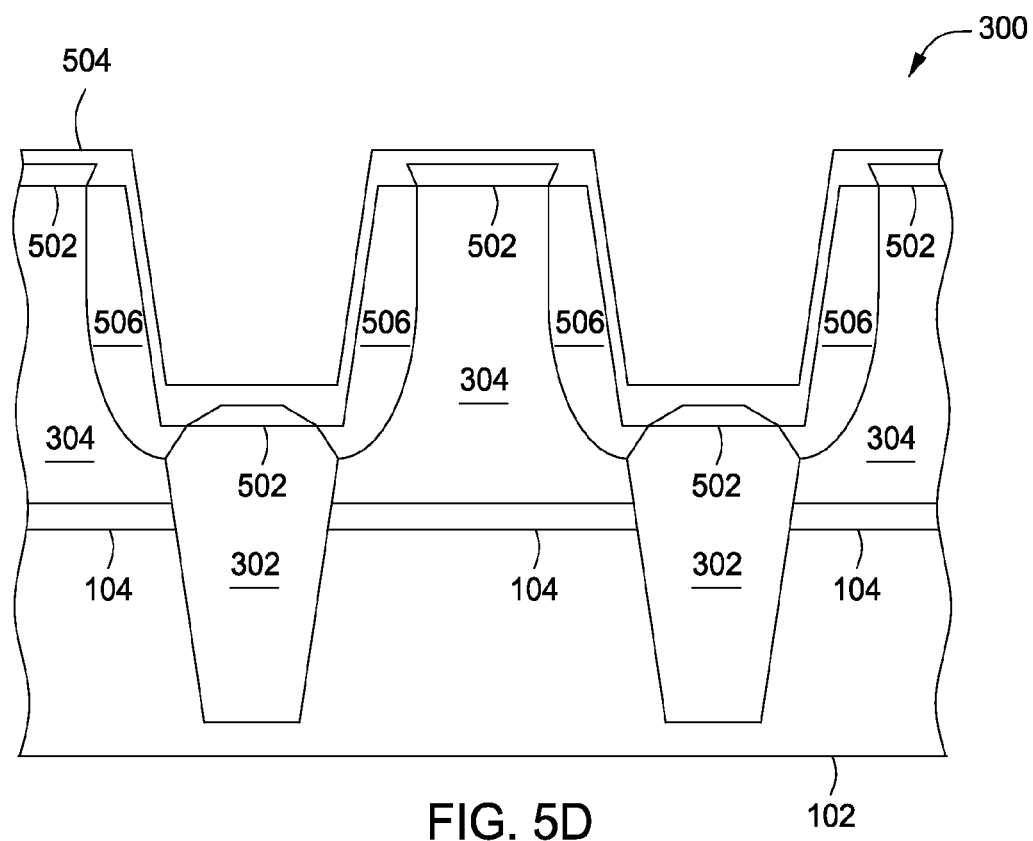

As illustrated in FIG. 5D, the oxidation process proceeds at a faster rate on the sidewalls of the material layer 304 forming an oxide layer 506 by generally consuming the material layer 304 from the sidewall inward. The remaining unconsumed portion of the material layer 304 may generally be in the desired shape of an inverted T. Further, and as illustrated in FIG. 5D the oxidation process continues to consume a portion of remaining nitride layer 502 and a portion of the STI region 302, albeit at a slower rate than the consumption of the material layer 304 at the sidewall.

Figure 5E:
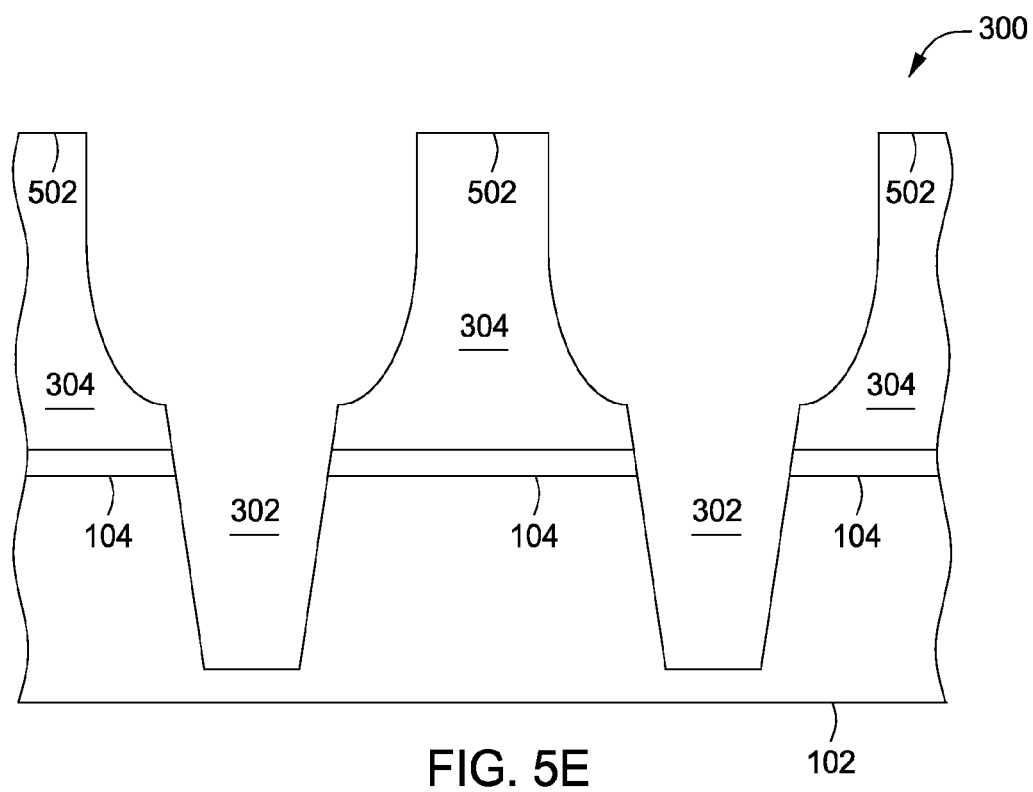

At 408, the oxynitride layer 504 and the oxide layer 506 may be removed, resulting in a floating gate having an inverted T shape as depicted in FIG. 5E. The layers may be removed by an etch process, for example, a wet or dry chemical etch, reactive ion etch, or the like as discussed above with respect to method 200. The etch process may be selective, for example, selectively removing the oxynitride layer 504 and oxide layer 506. In one embodiment, the etch process is selective to silicon oxide ($SiO_2$), silicon oxynitride (SiON), and silicon nitride (SiN), and removes the nitride layer 502 comprising SiN, the oxynitride layer 504 comprising SiON, and the oxide layer 506 comprising $SiO_2$ selective to the material layer 304 comprising polysilicon. The etch process may further selectively remove a portion of the STI region 302 as illustrated in FIG. 5E. In some embodiments, the etch process may be a multi-stage etch process. For example, initially the etch process may be selective to selective to only $SiO_2$ to remove the oxide layer 506. Next, the etch process may be SiON and SiN to remove the oxynitride layer 504 and the nitride layer 502. Upon completion of the etch process to form a floating gate having an inverted T shape, the memory device 200 may be processed further, for example, by depositing an IPD layer and a control gate layer, similar to those layers described with respect to FIG. 1. As discussed above, a gap fill and CMP of the filled region between adjacent material layers 304, followed by an etch of the filled region may be performed prior to deposition of the IPD layer.

As discussed above, a low thermal budget (e.g. low diffusion of materials such as one or more of dopants, oxygen ($O_2$) or silicon (Si)) may be desired in some embodiments, for example, to limit thickening of the tunnel oxide layer 104 or the STI region 302. However, if possible to limit such undesirable thickening effects, high thermal budget processes (i.e., high oxygen diffusion) may be utilized. For example, high thermal budget processes (e.g., wet, dry, or RTO) can provide conformal oxidation, faster oxidation rates, thicker oxidation (e.g., about 5 to about 15 nm thickness) and more efficient sidewall oxidation. In addition, high thermal budget oxidation processes provide reduced sensitivity to different crystallographic orientation of the material layer used to form a floating gate, thus advantageously generating a smooth surface during oxidation. Reduced sensitivity to crystallographic orientation may be desired, for example, when a material layer comprising a polycrystalline material is used to form a floating gate.

Smooth surfaces advantageously improve reliability in the memory device, for example, by reducing junction resistance, or the like.

Thus, in some embodiments, such as described below with respect to FIG. 6, a partially fabricated memory device 700 having a material layer 702 may be used to form a floating gate having an inverted T shape. The material layer 702 may be taller, for example, compared to the material layer 304 illustrated in FIGS. 3A and 5A, respectively. In addition, the height of the STI region 302 may be scaled with the height of the material layer 702 (for example, by depositing and etching back a gapfill material, such as $SiO_2$, as discussed above) to provide an increased distance between exposed surfaces thereof and the tunnel oxide layer, thereby facilitating resistance to oxidation diffusion into the tunnel oxide layer during high thermal budget processes. In some embodiments, a gap between the top of the material layer 702 and the top of the STI region 302 may be substantially equivalent in distance to that of similar structures illustrated in FIGS. 3A and 5A. The increased height of both the material layer 702 and the STI region 302 as compared with similar memory devices in FIGS. 3A and 5A, may advantageously lengthen the distance oxygen atoms have to travel to reach the tunnel oxide layer 104. The increased height of both structures allows for the use of a higher thermal budget oxidation process, while limiting thickening of the tunnel oxide layer 104. Thus, by increasing the height of the STI region 302 in the memory device 700, high thermal budget oxidation processes may advantageously be used to form a floating gate having an inverted T shape. Following the high thermal budget oxidation process and removal of an oxide layer formed thereby, an etch process and/or a more controllable low thermal budget oxidation process may be used to reduce the thickness at the base of the floating gate. Such a combination of a high thermal budget oxidation process with either an etch process or a low thermal budget oxidation process is described below with respect to FIGS. 6-8.

Figure 6:
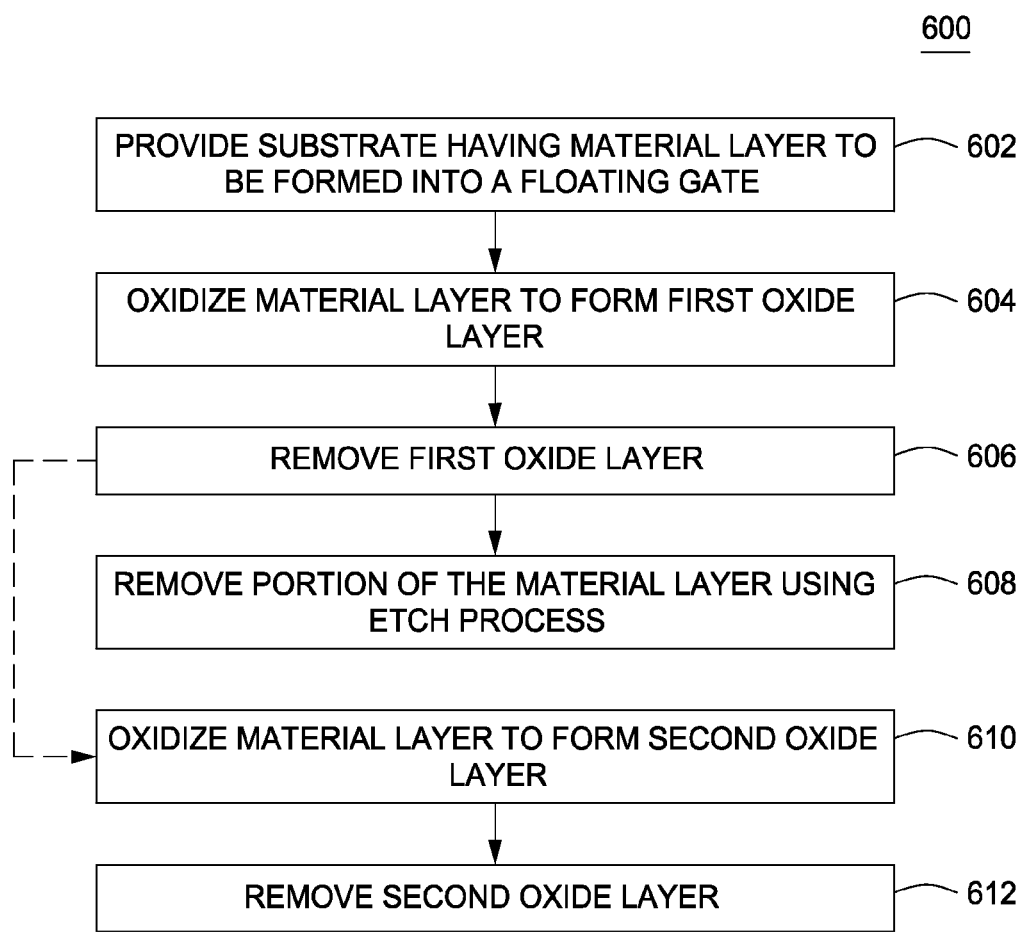
FIG. 6 depicts a flow chart for a method of forming a floating gate in accordance with some embodiments of the present invention.

For example, FIG. 6 depicts a method 600 of fabricating semiconductor device having a floating gate in accordance with some embodiments of the present invention. The method 600 is illustratively described with reference to FIGS. 7A-D and FIGS. 8A-B, which depicts stages of fabrication of a memory device 700 in accordance with embodiments of the method 600.

Figure 7A:
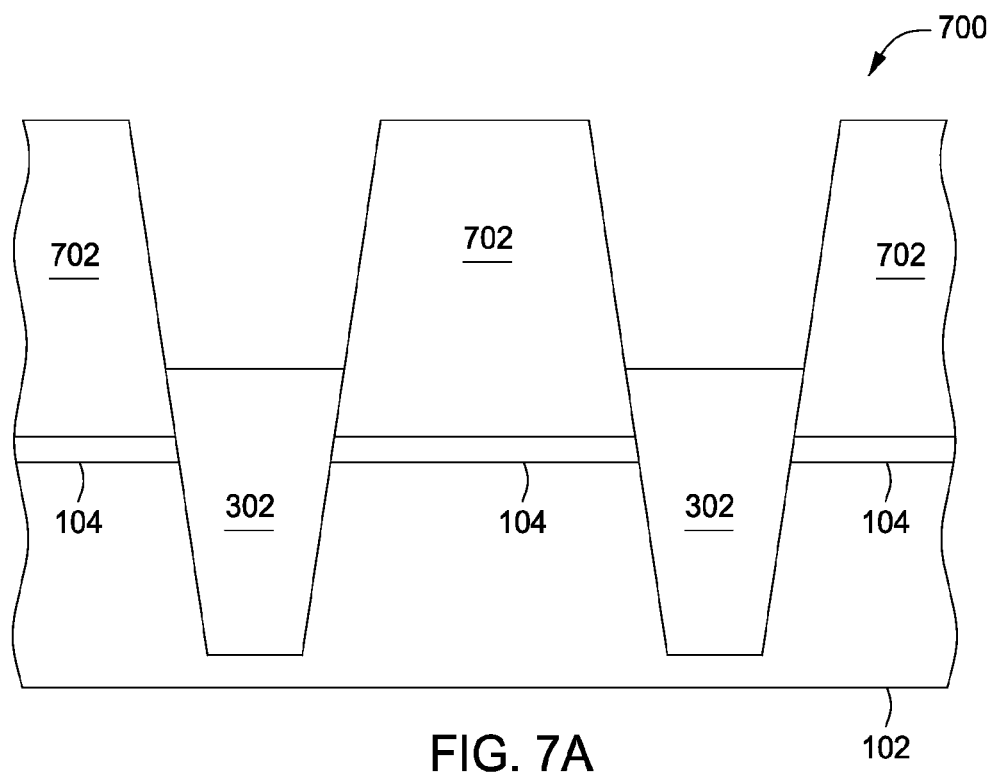
FIGS. 7A-D depict stages of fabrication of a floating gate in accordance with some embodiments of the method of FIG. 6.

The method 600 generally begins at 602, where a substrate having a material layer to be formed into a floating gate may be provided. For example, as shown in FIG. 7A, the substrate 102 and a material layer 702 may be part of a partially fabricated memory device 700. The memory device 700 may include the substrate 102 having the tunnel oxide layer 104 disposed thereon. The material layer 702 may be deposited atop the tunnel oxide layer 104. Shallow trench isolation (STI) regions 302 may be disposed in the substrate 102, adjacent to the tunnel oxide layer 104 and the material layer 702. The substrate 102, the tunnel oxide layer 104 and the STI regions 302 have been discussed above.

The material layer 702 may comprise a conductive material, such as polysilicon, a metal or the like. The material layer 702 may have a starting shape comprising a substantially rectangular or slightly trapezoidal cross section. The material layer 702 may generally have any suitable starting shape such that when oxidized and/or etched by the methods described herein, the material layer 702 may be formed into a floating gate having an inverted T shape. The material layer 702 may have a height of greater than about 30 nm, or up to about 130 nm. The material layer 702 may have a ratio of height to width of greater than about 2:1.

Figure 7B:
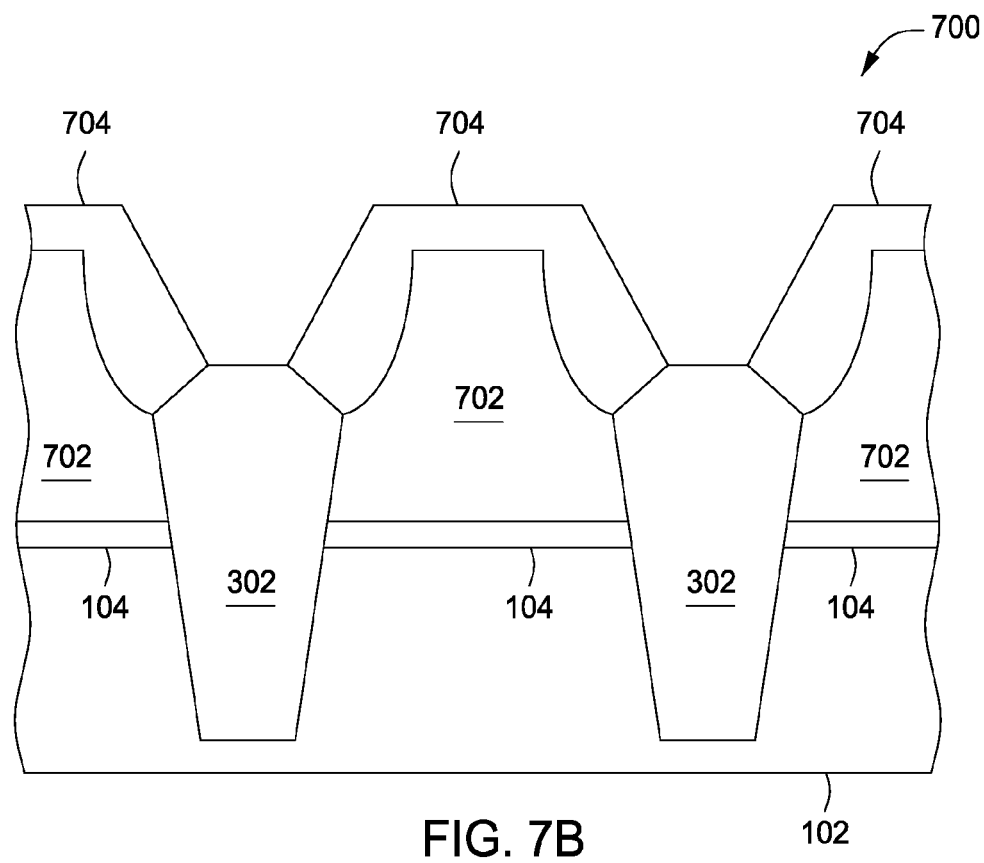

Next, at 604, the material layer 702 is selectively oxidized to form a first oxide layer 704 as shown in FIG. 7B. The first oxide layer 704 is formed on the top and sidewalls of the material layer 702, and may comprise a silicon oxide, metal oxide, or the like. In some embodiments, the first oxide layer 704 may consume the material layer 702 to a depth of about 5 to about 15 nm, or about 10 nm. The first oxide layer 704 may further thicken a portion of the STI region 302. The formation of the oxide layer may be performed using wet or oxidation, rapid thermal oxidation (RTO), radical oxidation, or plasma oxidation, for example, decoupled plasma oxidation (DPO). In some embodiments, where a low thermal budget and/or reduced diffusion of oxygen are desired, plasma oxidation or radical oxidation may be utilized. A low thermal budget may be required to prevent thickening of the tunnel oxide layer 104 during the oxidation of the material layer 702.

The remaining portion of the material layer 702 after oxidation may be generally in the shape of an inverted T having a greater dimensions than the desired final form (e.g., the height of the base and/or the width of the stem may be greater). At 606, the first oxide layer 704 is removed by an etch process resulting in the floating gate having a generally inverted T shape as illustrated by the remaining portion of the material layer 702 depicted in FIG. 7C. The etch process may be a wet or dry etch, or a reactive ion etch. The etch process may use chemicals or gases comprising hydrofluoric acid (HF) hydrochloric acid (HCl), or the like. The etch process may be selective, for example, selectively removing the first oxide layer 704. In one embodiment, the etch process is selective to silicon oxide, and removes the first oxide layer 704 comprising silicon oxide relative to the material layer comprising polysilicon. The etch process may further remove a portion of the STI region 302 during removal of the first oxide layer 704.

Figure 7C:
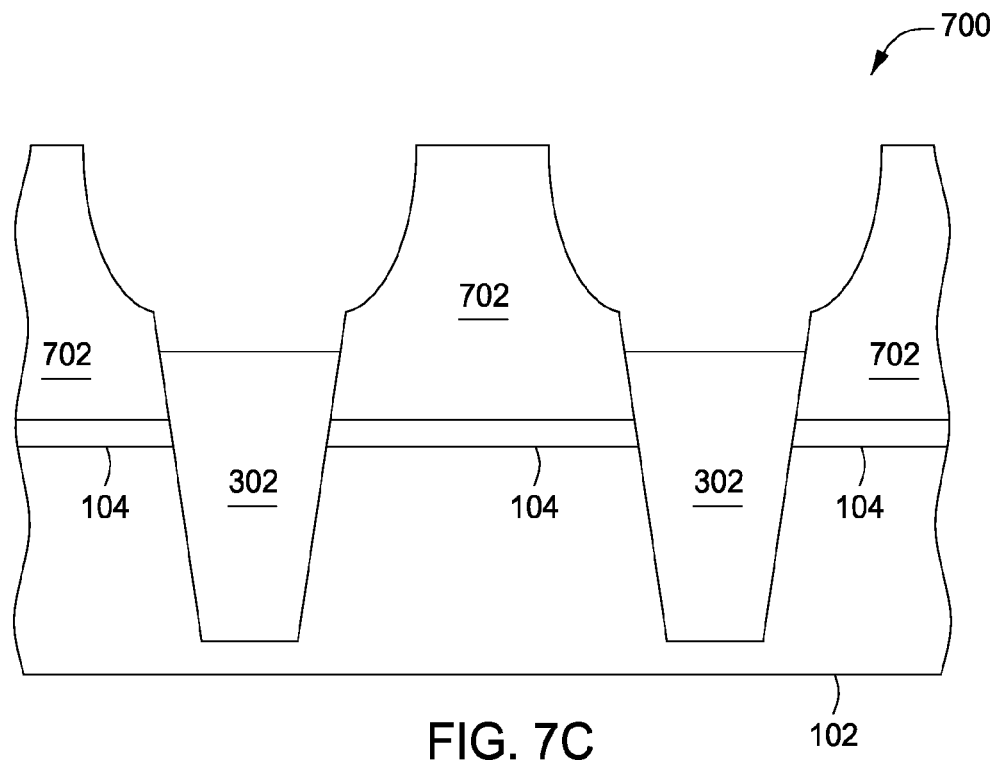
Figure 7D:
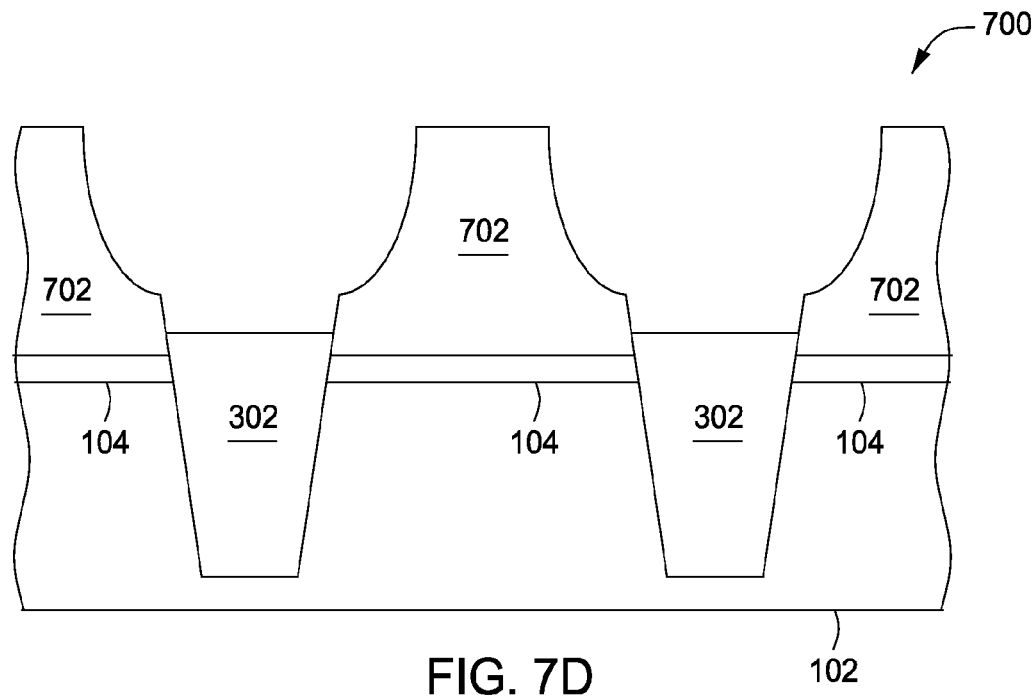

At 608, an etch process may be used to remove an additional portion of the remaining material layer 702 to form a floating gate having a desired inverted T shape, as depicted in FIG. 7D. The etch process may include wet or dry etch, reactive ion etch, or the like. In one embodiment, the etch process is a reactive ion etch. The floating gate formed using method 600 may be similar in dimension to the floating gates formed in methods 200 and 400, as discussed above.

Upon etching the material layer 702 to form a floating gate having an inverted T shape and the dimensions discussed above, the method 600 generally ends and further processing to complete the fabrication of the memory device may be performed. Further processing of the memory device 700 may include the deposition of an IPD layer and a control gate layer as discussed above. Optionally, a gap fill and CMP process, followed by an etch back of the filled region to control the desired depth of the IPD layer in the region between adjacent floating gates may be performed prior to the IPD layer deposition, as discussed above.

Figure 8A:
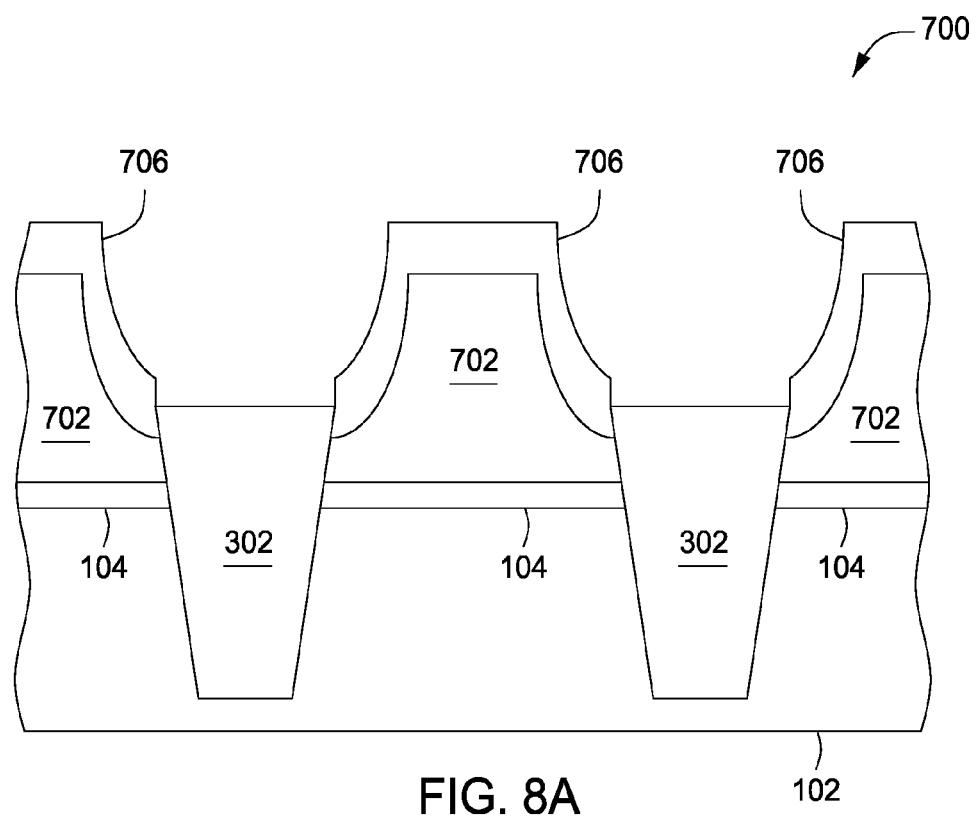
FIGS. 8A-B depict stages of fabrication of a floating gate in accordance with some embodiments of the method of FIG. 6.

Alternatively, in some embodiments, after removal of the first oxide layer 704, the method 600 may proceed from 606 to 610, where the material layer may be selectively oxidized to form a second oxide layer 706. The second oxide layer 706 is formed on the top and sidewalls of the remaining portion of the material layer 702 as depicted in FIG. 8A, and may comprise a silicon oxide, metal oxide, or the like. In some embodiments, the second oxide layer 706 may consume the material layer 702 to a depth of about 5 to about 15 nm, or about 10 nm. The formation of the oxide layer may be performed using wet or oxidation, rapid thermal oxidation (RTO), radical oxidation, or plasma oxidation, for example, decoupled plasma oxidation (DPO), and a low thermal budget and/or reduced diffusion of oxygen are desired, plasma oxidation or radical oxidation may be utilized. In some embodiments, low thermal budget directional oxidation (e.g., plasma oxidation) maybe used where the second oxide layer 706 grows at a higher rate on horizontal surfaces of the material layer 702 than on sidewall surfaces.

The remaining portion of the material layer 702 after selective oxidation to form the second oxide layer 706 may be generally in the shape of an invert T. At 612, the second oxide layer 706 is removed by an etch process to complete the formation of a floating gate having an inverted T as illustrated by the remaining portion of the material layer 702 depicted in FIG. 8B. The etch process may be a wet or dry etch, or a reactive ion etch. The etch process may use chemicals or gases comprising hydrofluoric acid (HF) hydrochloric acid (HCl), or the like. The etch process may be selective, for example, selective for removing the second oxide layer 706. In one embodiment, the etch process is selective to silicon oxide, and removes the second oxide layer 706 comprising silicon oxide relative to the material layer 702 comprising polysilicon. The etch process may further remove a portion of the STI region 302 during removal of second oxide layer 706.

Upon etching the remaining portion of material layer 702 to remove the second oxide layer 706 and form a floating gate having a desired inverted T shape the method 600 generally ends. The floating gate formed by the method 600 may have equivalent dimensions to those discussed above at 608. Further processing of the memory device 700 may include the deposition of an IPD layer and a control gate layer as discussed above.

Although high thermal budget processes may be advantageous for some embodiments, as discussed above, the inventors have discovered that the oxidation rate of a material layer, such as material layer 702 above, tends to saturate as higher thermal budgets are applied. For example, this can result in an inability to shape the material layer 702 into a shape having the desired dimensions, thickening of the tunnel oxide layer 104, or both. Further, the inventors have discovered that while the oxidation rate can saturate using any of a broad range of temperatures, for example between about 30 to about 1100 degrees Celsius, the initial oxidation rate is high even at lower temperatures in the range, such as 30 degrees Celsius. This temperature range is valid for all oxidation processes disclosed herein. In addition, plasma oxidation or photochemical (UV or ozone) or dry/wet chemical (e.g. ozone, nitric acid, hydrogen peroxide) based oxidation can occur at room temperature or below. Accordingly, the inventors have developed a method of shaping a material layer, such as material layer 702, which advantageously utilizes a high initial oxidation rate as discussed below.

Figure 10:
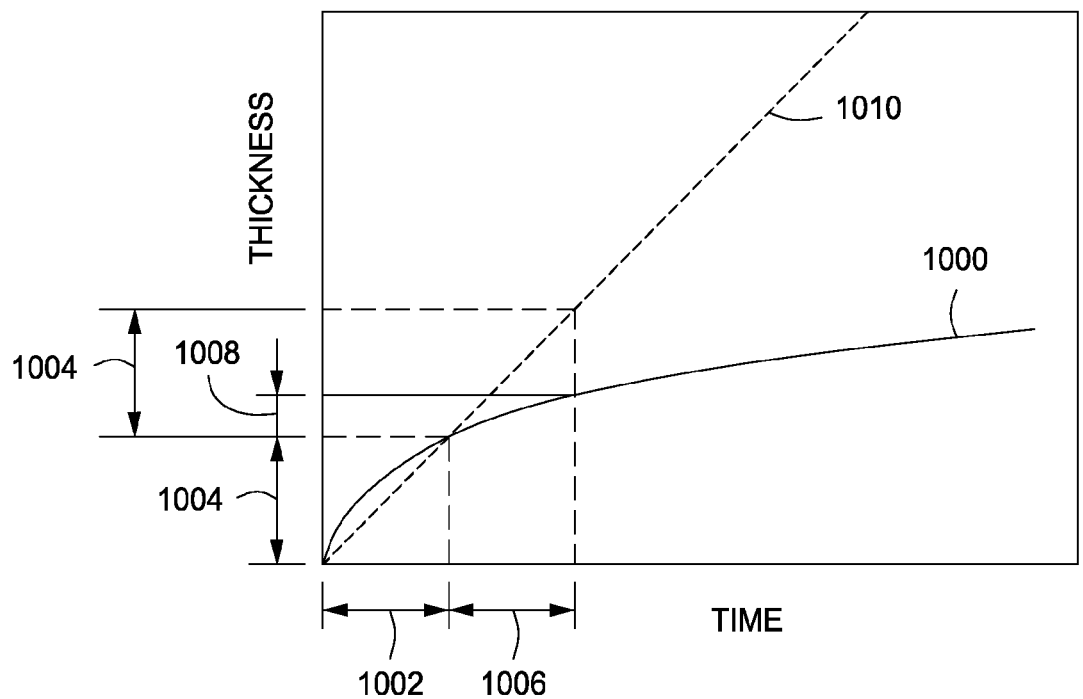
FIG. 10 depicts a schematic plot of oxide thickness as a function of time in accordance with some embodiments of the present invention.

A schematic illustration of saturation in the oxidation rate at high thermal budgets is shown in FIG. 10, which generally depicts a plot of an oxide layer thickness as a function of time. An isotherm 1000 is representative of an oxidation process where an oxide layer is continuously grown at a desired arbitrary temperature. Initially, over a first period 1002 of time in the isotherm 1000, the oxidation rate is high as illustrated by a first oxide layer thickness 1004 grown over the first period 1002. As time (and thermal budget) increases, the oxidation rate begins to saturate. For example, over a second period 1006 equivalent in duration to, and immediately following the first period 1002, a second oxide layer thickness 1008 grown during the second period 1006 is less than the first oxide layer thickness 1004 owing to a slower oxidation rate during the second period 1006. The inventors have further discovered that the general shape of the isotherm 1000 is followed at various temperatures.

Accordingly, to shape the material layer 702 to a desired shape, a high thermal budget may be required to achieve the necessary oxide layer thickness to form the desired dimensions of the floating gate. Unfortunately, during fabrication of some structures, the application of a high thermal budget oxidation process can undesirably cause oxygen ($O_2$) to diffuse into exposed oxide layers (such as the tunnel oxide layer 104), causing the oxide layer to undesirably thicken.

As such, in some embodiments of the method 600, a repetitive oxidation and etch processes may advantageously utilize the high initial oxidation rate applied during the first period 1002, as described in FIG. 10 above. For example, in some embodiments, at 604, a surface of a material layer (e.g., material layer 702) may be oxidized to form an oxide layer (e.g., first oxide layer 704) at an initial oxidation rate. The material layer 702 may be oxidized for a first period (e.g., first period 1002) of time where the initial oxidation rate is relatively high. After the oxidation rate decreases to a predetermined amount, for example during the second period 1006, the oxidation process is terminated. In some embodiments, the formation of the first oxide layer 704 may be terminated when the oxidation rate is about 90% or below, or about 75% or below, of the initial oxidation rate. In some embodiments, the formation of the first oxide layer 704 may be terminated when the oxidation rate is between about 0% to about 90%, or about 75%, of the initial rate.

Once the oxidation process has been terminated, at 606, at least some of the first oxide layer 704 is removed by an etching process (as discussed above and as illustrated in FIG. 7C). As illustrated in FIG. 7C, once the first oxide layer 704 has been removed, the material layer 702 may be at least partially formed into the desired shape as discussed above. The removal of the first oxide layer 704 provides a fresh exposed surface of the material layer 702 which can further be oxidized until the desired shape of the material layer is formed. In some embodiments, the etch process may be a two-stage condensation and sublimation etch process, as described above. In some embodiments, the etch process may be terminated when the etch rate falls to about 0% to about 75%, or to about 90% of the initial etch rate. The decrease in etch rate may be due to material contrast (e.g., Si to $SiO_2$ selectivity) or diffusion related saturation (e.g., on a homogeneous $SiO_2$ layer). The time dependency of the etch rate during the etch process may provide a method of additional and independent control of the material removal during the sacrificial oxidation. This provides the capability of layer-by-layer removal on a heterogeneous surface (Si/$SiO_2$) as exemplified in Floating Gate formation structures. This may be advantageously used when removing oxidized materials from a heterogeneous substrate to avoid non-uniform material removal.

For example, at 610, the exposed surface of the partially shaped material layer 702 is again oxidized to form another oxide layer (e.g., second oxide layer 706). The oxidation process proceeds at an initial oxidation rate that can be substantially equivalent to the initial oxidation rate discussed above for the first oxidation layer 704 due to the removal of the first oxide layer 704. As above, after the oxidation rate decreases to a predetermined amount, for example during the second period 1006, the oxidation process is terminated. The desired point of termination of the process can be any time similar to discussed above. Oxidation to form the second oxide layer 706 is illustrated in FIG. 8A.

Figure 8B:
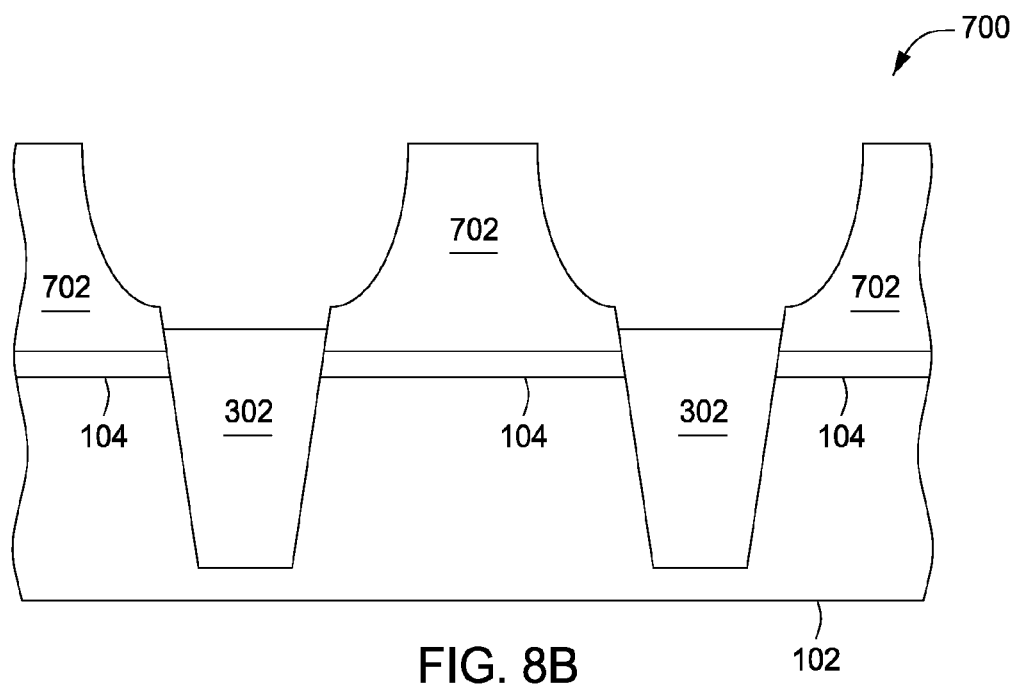

Once the repeated oxidation process has been terminated, at 612, at least some of the second oxide layer 706 is removed by an etching process (as discussed above and as illustrated in FIG. 8B). As illustrated in FIG. 8B, once the second oxide layer 706 has been removed, the material layer 702 may be formed into the desired shape, as discussed above. Alternatively, the removal of the second oxide layer 706 again provides a fresh exposed surface of the material layer 702 which can further be oxidized until the desired shape of the material layer is formed. As such, although disclosed as repeating oxidation and etch process just once, the repetition of these processes may continue as many times as necessary to form the desired shaped of the material layer (i.e., the process can be repeated one or more times).

The inventors have discovered that oxidizing in a cyclical process of oxidation and removal of an oxide layer makes it possible to form more oxide at the same thermal budget as compared to an oxidation process performed continuously. For example, as shown in FIG. 10, a continuously applied oxidation process such as illustrated by the isotherm 1000 applied over the first and second periods 1002, 1006 will form an oxide layer having a thickness which is the sum of the first and second thicknesses 1004, 1008. However, a cyclical oxidation and removal process, for example forming a first oxide layer (e.g., first oxide layer 704) over the first period 1002, removing the first oxide layer, and oxidizing the material layer to form a second oxide layer (e.g., second oxide layer 706) over the second period 1006 can result in a total oxide thickness (e.g., summation of the thicknesses of the first and second oxide layer 704, 706) which is twice the first thickness 1004 using the same thermal budget as a continuous oxidation process.

An isotherm 1010 which schematically illustrates the cyclical oxidation and removal process is shown in FIG. 10. As illustrated, the isotherm 1010 deviates substantially from the isotherm 1000 (representative of a continuous oxidation process) after the first period 1002. The isotherm 1010 is depicted as linear in FIG. 10, however, that is merely illustrative. The isotherm 1010 can have any shape based on how the cyclical oxidation and removal process is applied. For example, if each repeat oxidation process is for the same period of time (e.g., the first period 1002), then the isotherm 1010 can have a shape which repeats the shape of the isotherm 1010 during the first period 1002 at each successive step. Alternatively, a successive step in the cyclical oxidation and removal process may be applied for a different duration than the first period (not shown), and the shape of the isotherm 1010 can vary accordingly. However, the total oxide formed during the cyclical oxidation and removal process will be greater than that formed by a continuous oxidation process (e.g., isotherm 1000) using the same thermal budget. In some embodiments, the total oxide formed during the cyclical oxidation and removal process may be up to about 3 times greater than that formed by a continuously oxidation process using the same thermal budget.

The inventors have further discovered that the above cyclical oxidation and removal process can be advantageously used to form other structures, including structures having sub-lithographic dimensions. Such structures may include, for example, an ultra thin floating gate, the fin of a finFET device, a patterned hard mask, or the like.

Figure 11A:
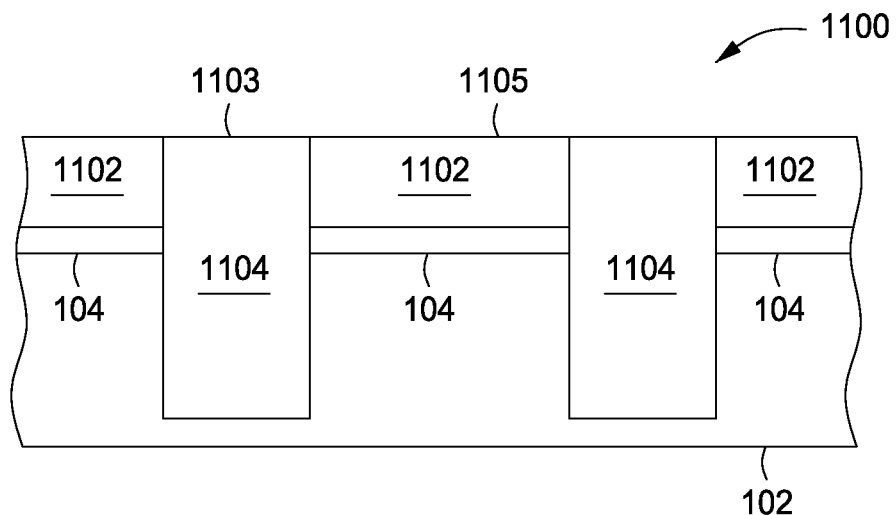
FIG. 11A-D depicts the stages of fabrication of a floating gate in accordance with some embodiments of the present invention.

For example, in some embodiments, the cyclical oxidation and removal process can be utilized to form an ultra thin floating gate as illustrated in FIGS. 11A-D. FIGS. 11A-D depict the stages of fabrication of a floating gate 1102 in accordance with some embodiments of the present invention. The method begins as shown in FIG. 11A by providing a partially fabricated memory device 1100. The memory device 1100 is similar in structure and composition to the memory device 100 discussed above. The memory structure 1100 includes the substrate 102 having the tunnel oxide layer 104 disposed thereon. A material layer 1102, similar in composition to any material layer discussed above, is disposed atop the tunnel oxide layer 104. An STI region 1104, similar in composition to the STI regions discussed above, is disposed on either side of the material layer 1102 and adjacent thereto. The STI regions 1104 separate the individual memory cells of the device 1100. Generally, a top surface 1103 of the STI region 1104 and a top surface 1105 of the material layer 1102 are substantially planar.

Figure 11B:
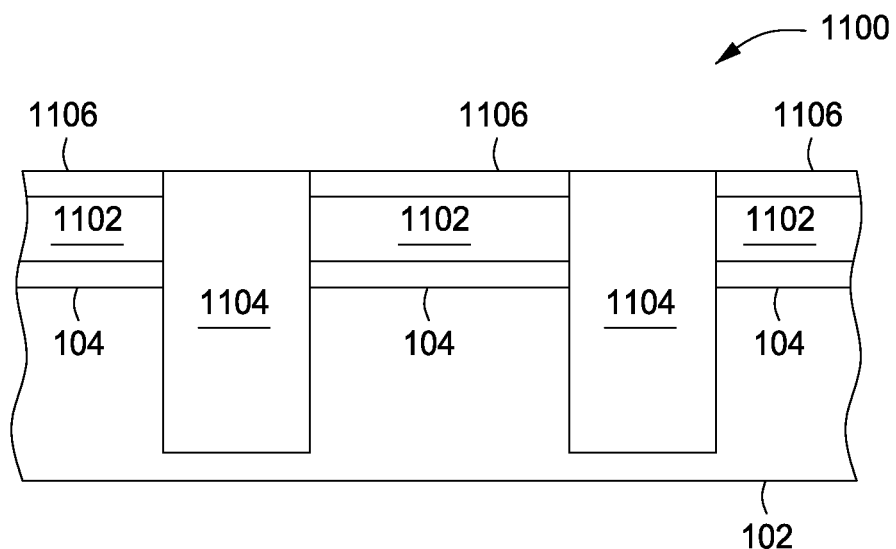
Figure 11C:
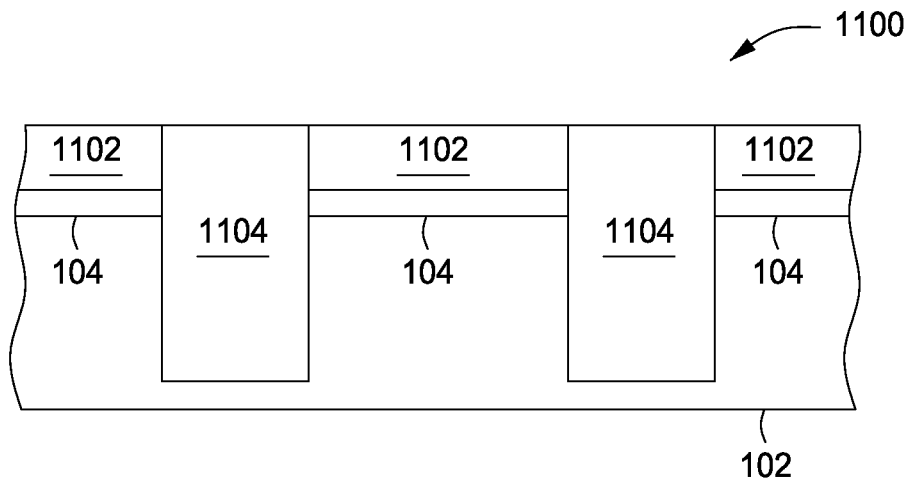

Next, the cyclical oxidation and removal process discussed above can be utilized to thin the material layer 1102 to a desired shape (e.g., thickness). The top surface 1105 of the material layer 1102 may be oxidized as discussed above to form an oxide layer 1106 at an initial oxidation rate as illustrated in FIG. 11B. The oxidation process is terminated when the oxidation rate falls below a specified percentage of the initial rate as discussed above. The oxide layer 1106 (along with a portion of the oxide in the STI region 1104) is then removed by an etch process as illustrated in FIG. 11C. The oxidation and removal processes can be repeated until the material layer 1102 is thinned to a desired shape to form a floating gate.

Figure 11D:
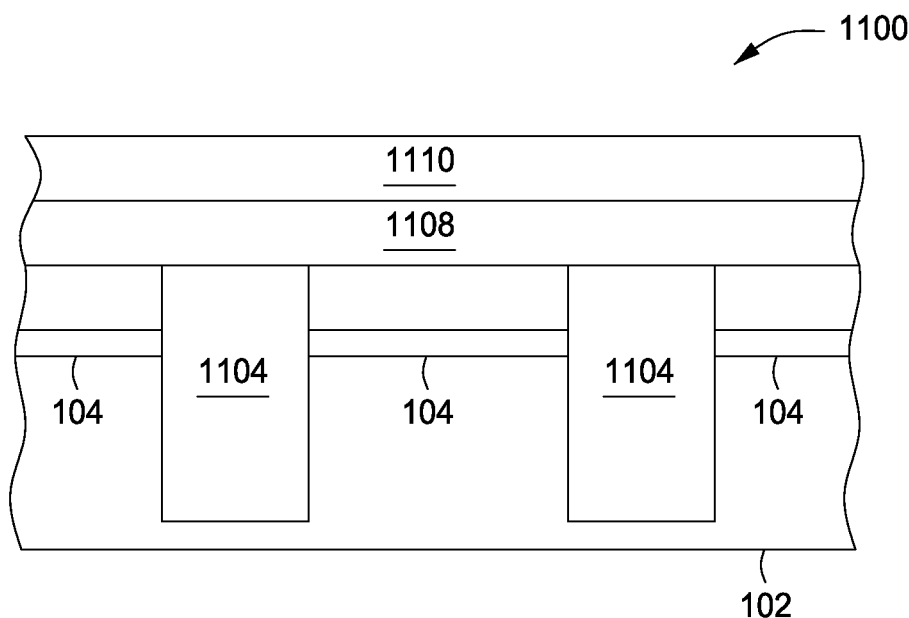

In some embodiments, the desired shape of the material layer 1102 may have a first width at the bottom of the material layer 1102 that is substantially equivalent to a second width at the top of the material layer 1102. Further, the desired shape may include a final thickness of the material layer 1102, for example, of less than about 5 nanometers (although other thicknesses are contemplated, for example, about 1 to about 20 nm, or about 1 to about 10 nm). The cyclical oxidation and removal process advantageously thins the material layer 1102 into the desired shape of a floating gate without unwanted oxidative thickening of the underlying tunnel oxide layer 104. The inventors have discovered that the oxide present in the STI region 1104 acts as a barrier to prevent the oxidation process from reaching the tunnel oxide layer 104. As illustrated in FIG. 11D, an IPD layer 1108 and conductive layer 1110 may be deposited atop the thinned material layer 1102 to form a completed memory device 1100. The IPD layer 1108 and the control gate layer 1100 each may comprise any suitable material or combination of materials for an IPD layer and control gate layer as discussed above.

Figure 12A:
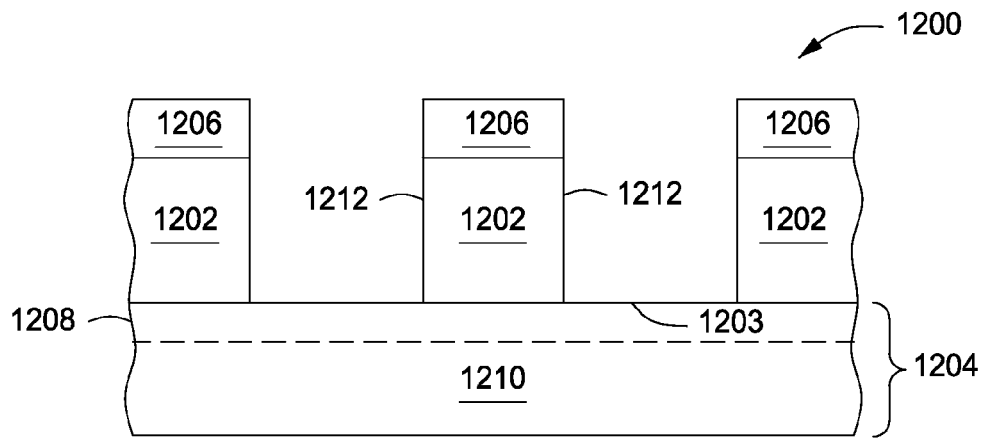
FIG. 12A-C depicts the stages of fabrication of a structure in accordance with some embodiments of the present invention.
Figure 12B:
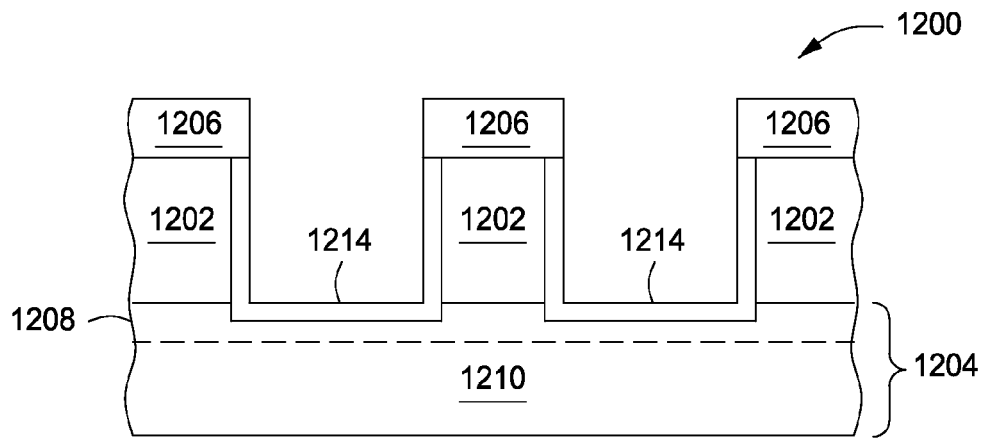
Figure 12C:
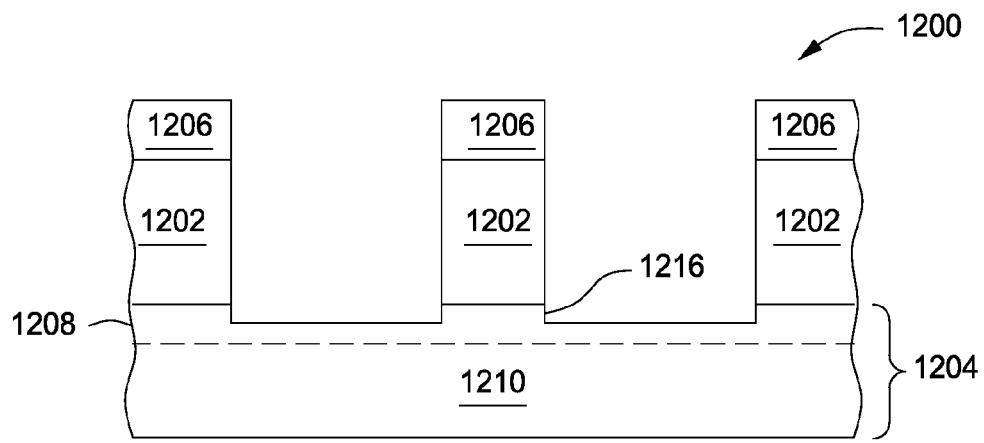

In some embodiments, the cyclical oxidation and removal process can be utilized to form structures to critical dimensions that are smaller than those dimensions accessible by lithographic techniques. For example, FIGS. 12A-C depicts the stages of utilizing the cyclical oxidation and removal process to trim a lithographically patterned structure 1200 to a sub-lithographic critical dimension. The structure 1200 may be, for example, a partially fabricated logic device, such as a FinFET, or a partially fabricated hard mask structure.

The structure 1200 includes a material layer 1202 deposited atop a substrate 1204. The material layer 1202 may be deposited as illustrated in FIG. 12A such that one or more portions of the upper surface 1203 of the substrate 1204 remain exposed. A mask layer 1206 may be deposited atop the material layer 1202. The mask layer 1206, for example, may have been used to pattern the material layer 1202 to a lithographically defined critical dimension.

The substrate 1204 may be any suitable substrate as discussed above. In some embodiments, for example in the fabrication of a logic device the substrate 1204 may comprise silicon (Si) or silicon dioxide ($SiO_2$). In some embodiments, for example in the fabrication of a hard mask structure, the substrate 1204 may comprise a layer 1208 (illustrated by dotted line in FIGS. 12A-C) deposited atop a non-silicon layer 1210 to be patterned by the hard mask. The layer 1208 may function as a second hard mask when etching the non-Si layer 1210. The layer 1208 may comprise one or more of silicon dioxide ($SiO_2$), silicon nitride (SiN), aluminum oxide ($Al_2O_3$) or other materials deposited at low temperatures, or a buried oxide formed during silicon on insulator (SOI) fabrication. The non-silicon layer 1210 may comprise metals, such as one or more of tungsten (W), titanium nitride (TiN) or the like, and/or a dielectric material, such as $SiO_2$, high-k binary oxides, ternary oxides, phase-change materials (such as nickel oxide, germanium antimony telluride, or the like) and/or alternate channel materials in Group IV (e.g., Ge, SiGe), and/or III-V materials (e.g., GaAs, GaN, InP etc) and/or organics (e.g., pentacene, fullerenes, or the like). Some materials may degrade at temperatures above about 100 degrees Celsius, but can benefit from sub-lithographic patterning made accessible by the inventive methods to enhance device performance.

The mask layer 1206 may be any suitable mask layer such as a hard mask or photoresist layer. The mask layer 1206 may comprise at least one of $SiO_2$, SiN, silicides, such as titanium silicide (TiSi), nickel silicide (NiSi) or the like, or silicates, such as aluminum silicate (AlSiO), zirconium silicate (ZrSiO), hafnium silicate (HfSiO), or the like.

The cyclical oxidation and removal process discussed above can be applied to the existing structure 1200 to trim the lithographically patterned material layer 1202 to a sub lithographic critical dimension. As illustrated in FIG. 12A, a side wall 1212 of the material layer 1202 and, in some embodiments the exposed upper surface 1203 of the substrate 1204 may be oxidized to form an oxide layer 1214 at an initial oxidation rate as discussed above. The oxidation process may be terminated after a first period of time when the initial oxidation rate falls below a fraction of the initial rate as discussed above.

The oxide layer 1214 is removed, as shown in FIG. 12C, using an etch process, which may be any suitable etch process, as discussed above. The oxidation and removal processes may be repeated as necessary to form the material layer 1202 to a desired shape, for example, having a desired sub-lithographic dimension. In some embodiments where the substrate 1204 (or the oxide layer 1208) is at least partially consumed by the oxidation and/or etch processes, upon completion of the cyclical oxidation and etch process, the material layer 1202 may be disposed on a raised portion 1216 of the substrate 1204 formed by the cyclical process. The raised portion 1216 may have a width that is substantially equivalent to a first width proximate the bottom of the material layer 1202 and a second width proximate the top of the material layer 1202. In some embodiments, the first width and second width of the trimmed material layer 1202 may be between about 1 to about 30 nanometers. In some embodiments, the trimmed material layer 1202 (e.g., the desired shape of the material layer) has an aspect ratio of between about 0.5 to about 20. In some embodiments, the height of the trimmed material layer 1202 is between about 1 to about 30 nanometers. Alternatively, in some embodiments, the substrate may substantially not be consumed by the cyclic process and the raised portion 1216 may not be present. For example, the raised portion maybe avoided if the etch process is selective to the material of the layer 1208, e.g., a layer 1208 comprising SiN may not be etched while etching $SiO_2$ in some embodiments.

The structure 1200 after trimming the material layer 1202 using the cyclical oxidation and removal process may be further processed. For example, the material layer 1202 may be utilized as a fin in a FinFET device and a gate layer and source/drain regions may be deposited. Alternatively, the trimmed material layer 1202 may itself be utilized to define the critical dimension of a hard mask to be formed from the substrate 1204. Further, the inventive methods may be advantageously utilized for the reduction of line-edge roughness and surface roughness created by lithography and fin etch. The reduction of roughness and variation on FinFET channel shape and sidewall surface may improve device and system performance by reducing noise and variability.

It is further contemplated that parts and/or the whole of the individual methods described above may be used interchangeably where appropriate to form a memory device having a floating gate with an inverted T shape. For example, a nitride layer (as discussed with respect to FIG. 4) may be deposited atop the material layer 702 of the partially fabricated memory device 700 (as discussed with respect to FIG. 6) to further limit thickening of the tunnel oxide layer. Other combinations and variations of the methods disclosed herein are similarly within the scope of the present invention.

The methods described herein, for example, such as oxidation and etch processes may be performed in a single substrate processing chamber configured to provide the respective process gases, plasmas, and the like, necessary to perform the processes discussed above. Alternatively, the methods described herein, for example, such as oxidation and etch processes may be performed in individual oxidation and etch chambers, respectively coupled to, or part of, a cluster tool, for example, an integrated tool 900 or an integrated tool 950 (i.e., cluster tool) described below with respect to FIG. 9A-B, respectively. Examples of the integrated tools include the CENTURA® and ENDURA® integrated tools, both available from Applied Materials, Inc., of Santa Clara, Calif. It is contemplated that the methods described herein may be practiced using other cluster tools having suitable process chambers coupled thereto.

The integrated tool 900 includes a vacuum-tight processing platform 901, a factory interface 904, and a system controller 902. The platform 901 comprises multiple processing chambers, such as 914A, 914B, 914C, and 914D operatively coupled to a vacuum substrate transfer chamber 903. The factory interface 904 is operatively coupled to the transfer chamber 903 by one or more load lock chambers (two load lock chambers, such as 906A and 906B shown in FIG. 9).

In some embodiments, the factory interface 904 comprises at least one docking station 907, at least one factory interface robot 938 to facilitate the transfer of the semiconductor substrates. The docking station 907 is configured to accept one or more front opening unified pod (FOUP). Four FOUPS, such as 905A, 905B, 905C, and 905D are shown in the embodiment of FIG. 9. The factory interface robot 938 is configured to transfer the substrates from the factory interface 904 to the processing platform 901 through the loadlock chambers, such as 906A and 906B. Each of the loadlock chambers 906A and 906B have a first port coupled to the factory interface 904 and a second port coupled to the transfer chamber 903. The load lock chamber 906A and 906B are coupled to a pressure control system (not shown) which pumps down and vents the chambers 906A and 906B to facilitate passing the substrates between the vacuum environment of the transfer chamber 903 and the substantially ambient (e.g., atmospheric) environment of the factory interface 904. The transfer chamber 903 has a vacuum robot 913 disposed therein. The vacuum robot 913 is capable of transferring substrates 921 between the load lock chamber 906A and 906B and the processing chambers 914A, 914B, 914C, and 914D.

In some embodiments, the processing chambers 914A, 914B, 914C, and 914D, are coupled to the transfer chamber 903. The processing chambers 914A, 914B, 914C, and 914D comprise at least one of an oxidation chamber, an etch chamber, and optionally, a deposition chamber for depositing a tunnel oxide layer, a material layer, an IPD layer, a control gate layer, or the like. Oxidation chambers may include those configured for plasma oxidation, rapid thermal oxidation, or radical oxidation. Etch chambers may include those configured for wet or dry etch, reactive ion etch (RIE), or the like. Examples of chambers suitable for performing at least some of the embodiments of the invention have been discussed above.

In some embodiments, one or more optional service chambers (shown as 916A and 916B) may be coupled to the transfer chamber 903. The service chambers 916A and 916B may be configured to perform other substrate processes, such as degassing, orientation, substrate metrology, cool down and the like, or alternatively maybe be equivalent to any of the process chambers 914A-D.

In some embodiments, the tool 900 may include multiple oxidation and etch chambers to perform the inventive methods described herein. For example, chambers 916B and 914D may be oxidation chambers and chambers 914A-C may be etch chambers. Such a tool configuration having multiple oxidation and etch chambers may improve process throughput. For example, the chamber configuration (e.g., the number of oxidation and etch chambers) may be selected based upon respective recipe times to optimize substrate throughput. For example, in some embodiments, where the duration of the etching process exceeds the oxidation process (for example, if etching exceeds oxidation by about 1.5 times or more), more etching chambers may be included to optimize process throughput. Alternatively, where the duration of the etching process is substantially equivalent to the duration of the oxidation process, an equivalent number of oxidation and etch chambers may be included on the tool to optimize process throughput. Alternatively, where the duration of the oxidation process exceeds the duration of the etching process, more oxidation chambers may be included on the tool to optimize process throughput.

The system controller 902 controls the operation of the tool 900 using a direct control of the process chambers 914A, 914B, 914C, and 914D or alternatively, by controlling the computers (or controllers) associated with the process chambers 914A, 914B, 914C, and 914D and the tool 900. In operation, the system controller 902 enables data collection and feedback from the respective chambers and systems to optimize performance of the tool 900. The system controller 902 generally includes a Central Processing Unit (CPU) 930, a memory 934, and a support circuit 932. The CPU 930 may be one of any form of a general purpose computer processor that can be used in an industrial setting. The support circuit 932 is conventionally coupled to the CPU 930 and may comprise a cache, clock circuits, input/output subsystems, power supplies, and the like. Software routines, such as a method of forming an floating gate as described above, when executed by the CPU 930, transform the CPU 930 into a specific purpose computer (controller) 902. The software routines may also be stored and/or executed by a second controller (not shown) that is located remotely from the tool 900.

Figure 9B:
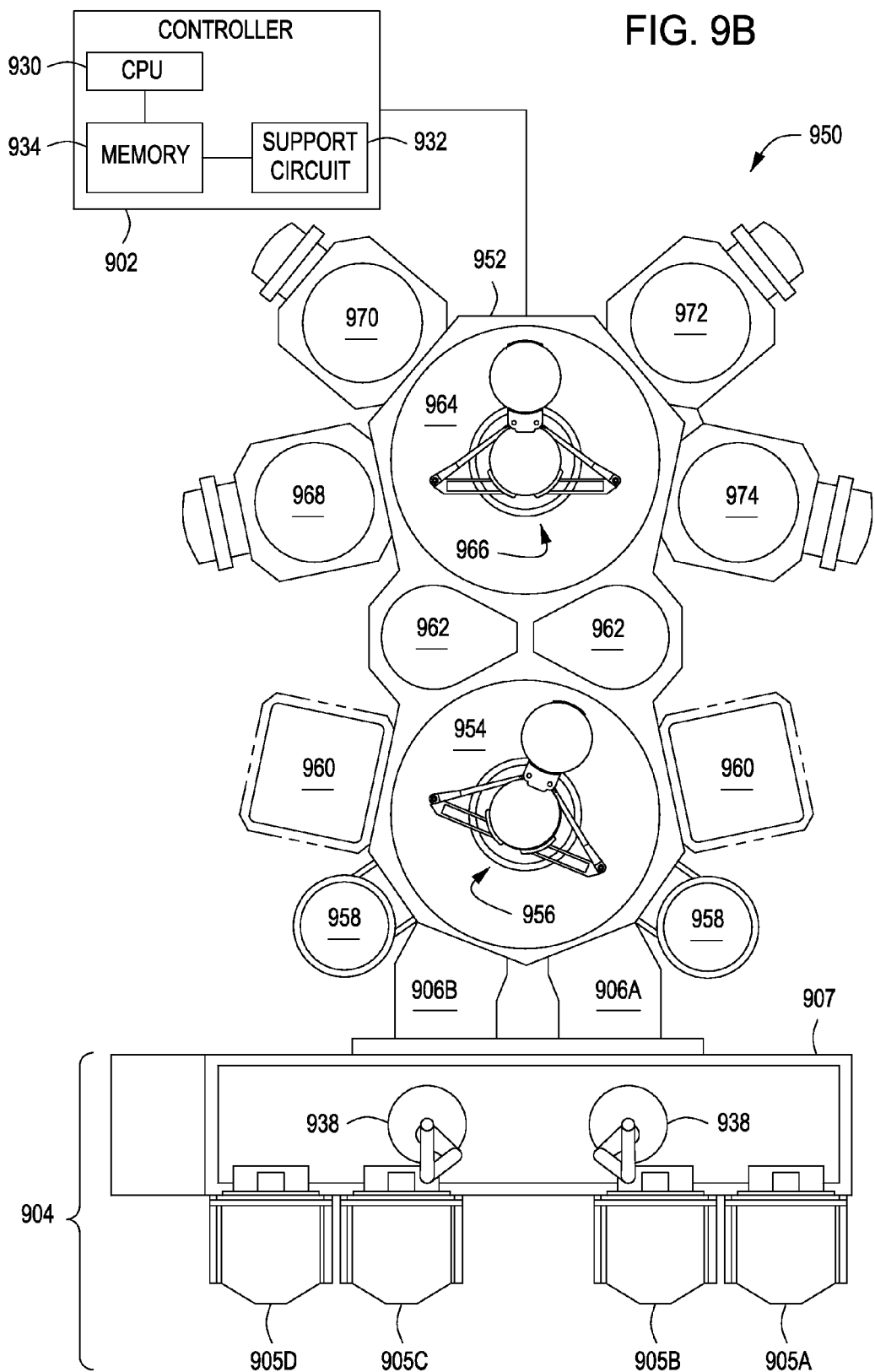

FIG. 9B is a schematic view of the integrated tool 950. The tool 950 is a two-staged vacuum processing system defined by a mainframe or platform 952 having a plurality of modules or chamber attached thereto. The tool 950 includes vacuum load-lock chambers 906A and 906B attached to a first stage transfer chamber 954. The load-lock chambers 906A and 906B maintain vacuum conditions within the first stage transfer chamber 954 while substrates enter and exit the tool 950. A first robot 956 transfers substrates between the load-lock chambers 906A and 906B and one or more substrate processing chambers 958 and 960 attached to the first stage transfer chamber 954. Processing chambers 958 and 960 can be configured to perform a number of substrate processing operations, such as chemical vapor deposition (CVD), physical vapor deposition (PVD), etch, pre-clean, degas, orientation and other substrate processes. The first robot 956 also transfers substrates to/from one or more transfer chambers 962 disposed between the first stage transfer chamber 954 and a second stage transfer chamber 964.

The transfer chambers 962 are used to maintain ultrahigh vacuum conditions in the second stage transfer chamber 964 while allowing substrates to be transferred between the first stage transfer chamber 954 and the second stage transfer chamber 964. A second robot 966 transfers substrates between the transfer chambers 962 and a plurality of substrate processing chambers 968, 970, 972 and 974. Similar to processing chambers 958 and 960, each of the processing chambers 968 to 974 can be configured to perform a variety of substrate processing operations.

The process chambers 958, 960, 968, 970, 972, and 974 may be configured in a similar manner to optimize process throughput using the inventive methods as described above for tool 900. For example, the process chambers of tool 950 may include multiple oxidation and etch chambers. The number of oxidation and etch chambers may vary depending on the process recipes being utilized. For example, and as discussed above. The number of etch chambers may exceed the number of oxidation chambers when the duration of the etch process exceeds that of the oxidation process, or vice versa. Alternatively, the number of etch chambers may be equivalent to the number of oxidation chambers when the durations of the etch and oxidation processes are substantially equivalent. In some embodiments, a fixed substrate path to the different chambers may be implemented to maximize throughput. In some embodiments, an adaptive substrate path to the different chambers may be implemented through the controller in production. The adaptive substrate path may be useful, for example, in foundries or other fabs, where different recipe times may be required for the substrates in a FOUP.

The controller 902 may control the overall operation of the tool 950 and the individual processes performed in each of the substrate processing chambers in a similar manner as described above for the tool 900. The robots 956 and 966 are also operated by the controller to transfer substrates between the various processing chambers of the tool 950. Additionally, the controller may control and/or coordinate with other components or systems connected to the tool 950.

In some embodiments, the inventive method may be performed in a single reactor or chamber configured to perform oxidation, etch and, optionally, nitridation processes. The process chamber may be configured to perform an oxidation process including one or more of ultraviolet (UV)-, ozone-, thermal-, or plasma-based oxidation. As such a gas source may be coupled to the chamber to provide one or more oxygen containing gases for the oxidation process. The process chamber may further be configured to perform an etch process including one or more of plasma etching, or a two-stage etch including condensation and sublimation, as discussed above. The two-stage etch process can be activated with a plasma, or may be heat activated with no plasma provided. The process chamber is further configured with a thermal control system for rapidly controlling the temperature of the substrate to facilitate the two-stage etch process. For example, the process chamber may include a cyclical heating (and cooling) capability for cyclically heating and cooling the substrate. Such heating capability may include flash energy based systems (such as lamps, lasers, or the like), heat sources that provide a large thermal gradient between at least two predetermined substrate processing zones in the chamber (such as suitable to selectively maintain low substrate temperature suitable for condensation and high substrate temperature suitable for sublimation by positioning the substrate in the respective processing zone), or via the use of a combination of a remote plasma source for remote plasma activation of etching gases and a direct plasma source to provide plasma induced heating. The substrate support may be movable to support the substrate in the predetermined processing zones and may further include lift pins or other substrate lifting mechanisms to selectively raise the substrate from the support surface during heating portions of the process and return the substrate to the substrate support surface during cooling portions of the process. The substrate support may also have a cooling (or temperature control) system to maintain the substrate support at a predetermined temperature (such as proximate a condensation temperature for the etch process). For example, in some embodiments, the thermal control system is suitable to rapidly (e.g., in less than about 1 second, or up to about 10 seconds, or up to about 100 seconds) alter the substrate temperature from about 30 degrees Celsius (to facilitate condensation) to at least about 100 degrees Celsius (to facilitate sublimation).

Figure 13:
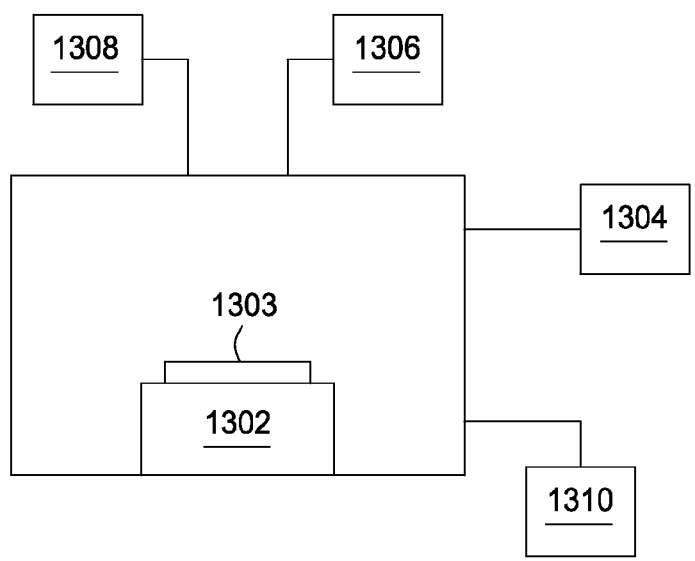
FIG. 13 depicts an exemplary process chamber in accordance with some embodiments of the present invention.

For example, a process chamber 1300 having such a configuration is illustrated in FIG. 13. The process chamber 1300 includes a substrate support 1302 disposed therein for supporting a substrate 1303 thereon. A gas source 1304 is coupled to the chamber 1300 to provide oxygen-containing gases, etching gases, and optionally inert gases and/or nitrogen-containing gases (for example, any of the gases discussed above). A plasma source 1306 may be coupled to the process chamber to provide energy to the gases provided by the gas source to form at least one of an oxidizing plasma or an etching plasma, and, optionally, a nitridizing plasma. A heating source 1308 is coupled to the process chamber to selectively heat the substrate, and, optionally, to provide energy to gases of the gas source to form at least one of an oxidizing or an etching chemistry. A controller 1310 is coupled to the process chamber 1300 for controlling the operation and components thereof. The controller 1310 may be similar to the controller 902, described above.

The gas source 1304 may be any suitable gas source, such as a gas panel having multiple gas sources or the like. The gas source 1304 is minimally configured to provide an oxygen-containing gas and an etching gas to respectively form one or more of, an oxidizing plasma, an etching plasma, an oxidizing chemistry, or a etching chemistry. Optionally, the gas source 1304 may also provide one or more inert gases and/or a nitrogen-containing gas to form a nitridizing plasma.

The plasma source 1306 may be any suitable plasma source or plurality of plasma sources, such as a remote plasma source, inductively coupled source, capacitively coupled source, a first source coupled to an overhead electrode (not shown) and a second source (not shown) coupled to the substrate support, or any other plasma source configurations to form a plasma. In some embodiments, the plasma source 1306 is configured to provide energy to the gases of the gas source 1304 to form the oxidizing plasma, the etching plasma and, optionally, the nitridizing plasma. In some embodiments, the plasma source can supply heat to the wafer for sublimation of reaction byproducts during etching.

The heating source 1308 may be any suitable heating source to heat the substrate and/or to form an oxidizing or etching chemistry from a gas provided by the gas source 1304. For example, the heating source may include one or more lamps configured to heat the substrate or gases provided by the gas source. Alternatively or in combination, the heating source may include a heater, such as a resistive heater or the like, which may for example be disposed in the substrate support 1302 or a gas showerhead for providing the process gases to the process chamber.

Thus, semiconductor devices suitable for narrow pitch applications and methods of fabrication thereof are described herein. The inventive methods may provide semiconductor devices have a floating gate configuration suitable for use in narrow pitch applications, such as at device nodes of 32 nm and below. Such semiconductor devices may include, for example, NAND and NOR flash memory devices. The floating gate configuration provided herein advantageously provides semiconductor devices having maintained or improved sidewall capacitance between a floating gate and a control gate, and reduced interference or noise between adjacent floating gates in such devices.

Further, the inventive methods disclosed herein advantageously form the inventive semiconductor devices while limiting undesired processes, such as oxygen diffusion which can, for example, thicken a tunnel oxide layer of the inventive device. The inventive methods can advantageous be applied towards the fabrication of other devices or structures, for example, such as FinFET devices or hard mask structures to overcome limitations in the critical dimension imposed by conventional lithographic patterning.

While the foregoing is directed to embodiments of the present invention, other and further embodiments of the invention may be devised without departing from the basic scope thereof.

The invention claimed is:

1. A semiconductor device, comprising:
   a substrate comprising a semiconductive material; and
   a floating gate disposed above the substrate and having a first width proximate a base of the floating gate that is greater than a second width proximate a top of the floating gate, wherein a width of the floating gate decreases non-linearly from the first width to the second width, and wherein a bottom-most portion of a sidewall of the floating gate is substantially vertical.

2. The device of claim 1, wherein the first width is between about 5 to about 35 nm and wherein the second width is between about 1 to about 30 nm.

3. The device of claim 1, wherein a difference between the first width and the second width is greater than about 4 nm.

4. The device of claim 1, wherein the floating gate further comprises an upper portion having a substantially vertical sidewall.

5. The device of claim 4, wherein a ratio of a height of the upper portion to the height of the floating gate is greater than about 5 percent.

6. The device of claim 4, wherein a height of the upper portion is between about 5 to about 100 nm.

7. A semiconductor device, comprising:
   a substrate comprising a semiconductive material;
   a floating gate disposed above the substrate and having a first width proximate a base of the floating gate that is greater than a second width proximate a top of the floating gate, wherein a width of the floating gate decreases non-linearly from the first width to the second width;
   a tunnel oxide layer disposed between the substrate and the floating gate;
   a shallow trench isolation region disposed adjacent to the tunnel oxide layer;
   an inter-poly dielectric layer disposed atop the floating gate and having a well formed therein, wherein the well is disposed adjacent to the floating gate and along a sidewall thereof; and
   a conductive layer disposed atop the inter-poly dielectric layer and within the well.

8. The device of claim 7, wherein the well has a width of between about 4 to about 20 nm and a depth of between about 20 to about 90 nm.

\* \* \* \* \*